United States Patent
Zhang et al.

(10) Patent No.: US 11,071,116 B2
(45) Date of Patent: Jul. 20, 2021

(54) CODING/DECODING METHOD, APPARATUS, AND DEVICE

(71) Applicant: HUAWEI TECHNOLOGIES CO., LTD., Guangdong (CN)

(72) Inventors: Huazi Zhang, Hangzhou (CN); Yunfei Qiao, Hangzhou (CN); Rong Li, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 29 days.

(21) Appl. No.: 16/664,135

(22) Filed: Oct. 25, 2019

(65) Prior Publication Data

US 2020/0059934 A1 Feb. 20, 2020

Related U.S. Application Data

(63) Continuation of application No. PCT/CN2018/083827, filed on Apr. 20, 2018.

(30) Foreign Application Priority Data

Apr. 25, 2017 (CN) .......................... 201710279452.1

(51) Int. Cl.
*H04W 72/04* (2009.01)
*H04W 76/11* (2018.01)
(Continued)

(52) U.S. Cl.
CPC ....... *H04W 72/0466* (2013.01); *H03M 13/09* (2013.01); *H03M 13/13* (2013.01); *H03M 13/616* (2013.01); *H04W 76/11* (2018.02)

(58) Field of Classification Search
CPC . H04W 72/0466; H04W 76/11; H03M 13/09; H03M 13/13; H03M 13/616;
(Continued)

(56) References Cited

U.S. PATENT DOCUMENTS

| | | |
|---|---|---|
| 2009/0191825 A1 | 7/2009 | Georgantas et al. |
| 2015/0194987 A1 | 7/2015 | Li et al. |
| 2020/0059934 A1 | 2/2020 | Zhang et al. |

FOREIGN PATENT DOCUMENTS

| | | |
|---|---|---|
| CN | 101098299 A | 1/2008 |
| CN | 102299735 A | 12/2011 |

(Continued)

OTHER PUBLICATIONS

Extended European Search Report issued in European Application No. 18790149.1 dated Mar. 17, 2020, 30 pages.
(Continued)

*Primary Examiner* — Walter J Divito
(74) *Attorney, Agent, or Firm* — Fish & Richardson P.C.

(57) ABSTRACT

The present disclosure relates to coding/decoding methods, apparatus, and devices. One example method includes obtaining, by a sending device, positions of information bits, positions of fixed bits, and positions of assistant bits, allocating the information bits, the fixed bits, and the assistant bits in a to-be-coded sequence based on the obtained positions, obtaining a scrambling sequence, obtaining a scrambling sequence, scrambling a bit in a to-be-scrambled bit set based on the scrambling sequence to obtain a scrambled sequence, and performing polar coding to obtain a coded sequence for sending.

20 Claims, 9 Drawing Sheets

(51) Int. Cl.
*H03M 13/09* (2006.01)
*H03M 13/13* (2006.01)
*H03M 13/00* (2006.01)

(58) Field of Classification Search
CPC ... H04L 1/0061; H04L 1/0057; H04L 1/0041; H04L 1/0065; H04L 1/0045; H04L 1/0009
See application file for complete search history.

(56) References Cited

FOREIGN PATENT DOCUMENTS

| | | |
|---|---|---|
| CN | 103684477 A | 3/2014 |
| CN | 105680883 A | 6/2016 |
| CN | 107342774 A | 11/2017 |
| EP | 3484126 A1 | 5/2019 |
| WO | 2018127139 A1 | 7/2018 |

OTHER PUBLICATIONS

Intel Corporation, "Polar code design," 3GPP TSG RAN WG1 Ad hoc, R1-1700386, Spokane, USA, XP051207923, Jan. 18-20, 2017, 12 pages.
MediaTek Inc., "Group Conman PDCCH design," 3GPP TSG RAN WG1 Meeting #88bis, R1-1704443, Spokane, USA, XP051242590, Apr. 3-7, 2017, 6 pages.
Office Action issued in Chinese Application No. 201910253999.3 dated Dec. 9, 2019, 9 pages (with English translation).
PCT International Search Report and Written Opinion issued in International Application No. PCT/CN2018/083827 dated Jun. 27, 2018, 19 pages (with English translation).

CODING/DECODING METHOD, APPARATUS, AND DEVICE

CROSS-REFERENCE TO RELATED APPLICATIONS

This application is a continuation of International Application No. PCT/CN2018/083827, filed on Apr. 20, 2018, which claims priority to Chinese Patent Application No. 201710279452.1, filed on Apr. 25, 2017. The disclosures of the aforementioned applications are hereby incorporated by reference in their entireties.

TECHNICAL FIELD

This application relates to communications technologies, and in particular, to a coding/decoding method, apparatus, and device.

BACKGROUND

With fast evolution of wireless communications, it is predicted that a future 5G communications system will have some new features. Three most typical communication scenarios include enhanced mobile broadband (eMBB), massive machine type communications (mMTC), and ultra-reliable and low latency communications (URLLC). Requirements of the communication scenarios pose new challenges to a Long Term Evolution LTE) technology. Channel coding that is used as a most basic radio access technology is one of important research objects to meet 5G communication requirements.

Polar coding is novel channel coding proposed by E. Arikan in 2008. Designed based on channel polarization, the polar coding is the first code construction scheme that provably achieves a channel capacity by using a strict mathematical method. A polar code is a linear block code.

However, in the prior art, there is still no definite solution to a coding mode that can improve efficiency of coding and decoding and improve channel detection latency performance.

SUMMARY

This application provides a coding/decoding method, apparatus, and device, to improve efficiency of coding and decoding and improve channel detection latency performance.

A first aspect of this application provides a coding method, where the method includes:

obtaining, by a sending device, positions of information bits, positions of fixed bits, and positions of assistant bits;

allocating, by the sending device, the information bits, the fixed bits, and the assistant bits in a to-be-coded sequence based on the positions of the information bits, the positions of the fixed bits, and the positions of the assistant bits;

obtaining, by the sending device, a scrambling sequence, and scrambling a bit in a to-be-scrambled bit set based on the scrambling sequence to obtain a scrambled sequence, where the to-be-scrambled bit set is determined based on the fixed bits and/or the assistant bits;

performing, by the sending device, polar coding on the scrambled sequence to obtain a coded sequence; and sending, by the sending device, the coded sequence.

In this solution, the to-be-scrambled bit set may be determined based on the fixed bits and/or the assistant bits. The sending device may select several bits from the fixed bits in a specific manner to constitute the to-be-scrambled bit set, or may select several bits from the assistant bits in a manner to form the to-be-scrambled bit set, or may select several bits from the fixed bits and the assistant bits respectively to constitute the to-be-scrambled bit set. The selection manner may be determined by the sending device through negotiation with a receiving device, or may be specified in a protocol.

In this solution, the sending device configures corresponding bit values in the to-be-coded sequence based on the determined positions of the information bits, positions of the fixed bits, and positions of the assistant bits, in other words, configures all of the information bits, the fixed bits, and the assistant bits in the to-be-coded sequence. Then, the sending device obtains at least one bit from the fixed bits and/or the assistant bits as the to-be-scrambled bit set, determines the scrambling sequence, scrambles the bit in the to-be-scrambled bit set to obtain the scrambled sequence, and performs coding and subsequent processing for sending. In this way, in a decoding process, the receiving device can eliminate a signal that does not come from the sending device in advance based on the scrambled bit, to shorten a coding latency, and accelerate channel detection.

Optionally, the scrambling sequence is a radio network temporary identifier (RNTI) sequence of the sending device or a part of an RNTI or a sequence of repeated RNTIs.

Optionally, the to-be-scrambled bit set includes any one of the following sets:

a set including at least one of the fixed bits in descending order of reliability, starting from the highest;

a set including at least one of the fixed bits in ascending order of reliability, starting from the lowest;

a set including at least one of the fixed bits before an information bit;

a set including at least one of the fixed bits in descending order of row weights of a corresponding polar coding matrix, starting from the highest;

a set including at least one of the assistant bits in ascending order of positions, starting from the foremost;

a set including at least one of the assistant bits in descending order of reliability, starting from the highest;

a set including at least one of the assistant bits in ascending order of reliability, starting from the lowest;

a set including at least one of the assistant bits in descending order of row weights of a corresponding polar coding matrix, starting from the highest;

a set including at least one of the fixed bits and the assistant bits in ascending order of positions, starting from the foremost;

a set including at least one of the fixed bits and the assistant bits in ascending order of reliability, starting from the lowest;

a set including at least one of the fixed bits and the assistant bits in descending order of reliability, starting from the highest; and a set including at least one of the fixed bits and the assistant bits in descending order of row weights of a corresponding polar coding matrix, starting from the highest.

In a specific implementation, the scrambling a bit in the to-be-scrambled bit set based on the scrambling sequence to obtain a scrambled sequence includes:

performing, by the sending device, an exclusive-OR operation on the scrambling sequence and a corresponding bit in the to-be-scrambled bit set, and allocating an obtained bit in a corresponding position to obtain the scrambled sequence.

In a specific implementation, the assistant bits include at least one of the following bits: a CRC bit a PC bit and a hash bit.

In a specific implementation when a length of the scrambling sequence is greater than a quantity of bits in the to-be-scrambled bit set, before the scrambling a bit in the to-be-scrambled bit set based on the scrambling sequence to obtain a scrambled sequence, the method further includes:

obtaining, by the sending device from the scrambling sequence, a quantity of bits the same as that of bits in the to-be-scrambled bit set to serve as a new scrambling sequence.

A second aspect of this application provides a decoding method, including:

obtaining, by a receiving device, a to-be-decoded sequence; and decoding and checking, by the receiving device, the to-be-decoded sequence in sequence; and when decoding a scrambled bit, checking the scrambled bit, and if the check fails, terminating the decoding, where the scrambled bit is obtained after a bit in a scrambled bit set is scrambled by using a scrambling sequence, and the scrambled bit set is determined based on fixed bits and/or assistant bits.

In this solution, a decoding device performs decoding and checking after receiving, detecting, and obtaining the to-be-decoded sequence. In the decoding process, when decoding a scrambled bit scrambled by a sending device, the decoding device checks the scrambled bit, and if the check fails, does not perform subsequent decoding. In this way, a signal that does not come from the sending device is eliminated in advance, to shorten a decoding latency, and accelerate channel detection.

Optionally, the scrambled bit is a fixed bit, and the checking the scrambled bit includes:

performing checking based on a scrambled bit value obtained through decoding and a scrambled bit value obtained in advance, where if the scrambled bit value obtained through decoding is different from the scrambled bit value obtained in advance, the check fails.

A specific check manner is as follows: When the scrambled bit is the fixed bit, the scrambled bit value obtained through decoding is compared with the scrambled bit value obtained in advance. If the two bit values are different, the decoding is directly terminated, and there is no need to decode a subsequent bit. To be specific, in the decoding process, if the scrambled bit value obtained through decoding is different from the scrambled bit value obtained in advance, it is determined that the check fails, and the decoding is terminated.

Optionally, the scrambling sequence is an RNTI of the sending device or a part of an RNTI or a sequence of repeated RNTIs.

Optionally, the scrambled bit set includes any one of the following sets:

a set including at least one of the fixed bits in descending order of reliability, starting from the highest;

a set including at least one of the fixed bits in ascending order of reliability, starting from the lowest;

a set including at least one of the fixed bits before an information bit;

a set including at least one of the fixed bits in descending order of row weights of a corresponding polar coding matrix, starting from the highest;

a set including at least one of the assistant bits in ascending order of positions, starting from the foremost;

a set including at least one of the assistant bits in descending order of reliability, starting from the highest;

a set including at least one of the assistant bits in ascending order of reliability, starting from the lowest;

a set including at least one of the assistant bits in descending order of row weights of a corresponding polar coding matrix, starting from the highest;

a set including at least one of the fixed bits and the assistant bits in ascending order of positions, starting from the foremost;

a set including at least one of the fixed bits and the assistant bits in ascending order of reliability, starting from the lowest;

a set including at least one of the fixed bits and the assistant bits in descending order of reliability, starting from the highest; and a set including at least one of the fixed bits and the assistant bits in descending order of row weights of a corresponding polar coding matrix, starting from the highest.

In a specific implementation, the decoding and checking, by the receiving device, the to-be-decoded sequence in sequence includes:

determining, by the receiving device, positions of information bits, positions of the fixed bits, and positions of the assistant bits;

determining, by the receiving device, the scrambled bit set based on the positions of the fixed bits and/or the positions of the assistant bits; and performing, by the receiving device, polar decoding on the to-be-decoded sequence in sequence, checking the scrambled bit when decoding the scrambled bit, and terminating the decoding if the check fails.

Optionally, the assistant bits include at least one of the following bits: a CRC bit, a PC bit, and a hash bit.

A third aspect of this application provides a coding method, including:

obtaining, by a sending device, positions of information bits and assistant bits and positions of fixed bits;

determining, by the sending device, a position of a to-be-scrambled bit based on the positions of the information bits and the assistant bits;

allocating, by the sending device, the information bits, the fixed bits, and the assistant bits in a to-be-coded sequence based on the position of the to-be-scrambled bit, the positions of the information bits and the assistant bits, and the positions of the fixed bits;

obtaining, by the sending device, a scrambling sequence, and scrambling, based on the scrambling sequence, the to-be-scrambled bit to obtain a scrambled sequence;

performing, by the sending device, polar coding on the scrambled sequence to obtain a coded sequence; and sending, by the sending device, the coded sequence to a receiving device.

Optionally, the position of the to-be-scrambled bit includes any one of the following positions:

at least one of the positions of the information bits and the assistant its in ascending order of positions, starting from the foremost;

at least one of the positions of the information bits and the assistant bits in descending order of reliability, starting from the highest;

at least one of the positions of the information bits and the assistant bits in ascending order of reliability, starting from the lowest; and at least one of the positions of the information bits and the assistant bits in descending order of row weights of a corresponding polar coding matrix, starting from the highest.

A fourth aspect of this application provides a coding apparatus, where the apparatus includes:

a processing module, configured to obtain positions of information bits, positions of fixed bits, and positions of assistant bits, where the processing module is further configured to allocate the information bits, the fixed bits, and the assistant bits in a to-be-coded sequence based on the positions of the information bits, the positions of the fixed bits, and the positions of the assistant bits;

the processing module is further configured to obtain a scrambling sequence, and scramble a bit in a to-be-scrambled bit set based on the scrambling sequence to obtain a scrambled sequence, where the to-be-scrambled bit set is determined based on the fixed bits and/or the assistant bits; and the processing module is further configured to perform polar coding on the scrambled sequence to obtain a coded sequence; and a sending module, configured to send the coded sequence.

Optionally, the scrambling sequence obtained by the processing module is an RNTI of the coding apparatus or a part of an RNTI or a sequence of repeated RNTIs.

Optionally, the to-be-scrambled bit set determined by the processing module includes any one of the following sets:

a set including at least one of the fixed bits in descending order of reliability, starting from the highest;

a set including at least one of the fixed bits in ascending order of reliability, starting from the lowest;

a set including at least one of the fixed bits before an information bit;

a set including at least one of the fixed bits in descending order of row weights of a corresponding polar coding matrix, starting from the highest;

a set including at least one of the assistant bits in ascending order of positions, starting from the foremost;

a set including at least one of the assistant bits in descending order of reliability, starting from the highest;

a set including at least one of the assistant bits in ascending order of reliability, starting from the lowest;

a set including at least one of the assistant bits in descending order of row weights of a corresponding polar coding matrix, starting from the highest;

a set including at least one of the fixed bits and the assistant bits in ascending order of positions, starting from the foremost;

a set including at least one of the fixed bits and the assistant bits in ascending order of reliability, starting from the lowest;

a set including at least one of the fixed bits and the assistant bits in descending order of reliability, starting from the highest; and a set including at least one of the fixed bits and the assistant bits in descending order of row weights of a corresponding polar coding matrix, starting from the highest.

Optionally, the processing module is configured to:

perform an exclusive-OR operation on the scrambling sequence and a corresponding bit in the to-be-scrambled bit set, and allocate an obtained bit in a corresponding position to obtain the scrambled sequence.

Optionally, the assistant bits include at least one of the following bits:

a CRC bit, a PC bit, and a hash bit.

Optionally, when a length of the scrambling sequence is greater than a quantity of bits in the to-be-scrambled bit set, the processing module is further configured to:

obtain, from the scrambling sequence, a quantity of bits the same as that of bits in the to-be-scrambled bit set to serve as a new scrambling sequence.

A fifth aspect of this application provides a decoding apparatus, including:

an obtaining module, configured to obtain a to-be-decoded sequence; and a processing module, configured to decode and check the to-be-decoded sequence in sequence; and when decoding a scrambled bit, check the scrambled bit, and if the check fails, terminate the decoding, where the scrambled bit is obtained after a bit in a scrambled bit set is scrambled by using a scrambling sequence, and the scrambled bit set is determined based on fixed bits and/or assistant bits.

Optionally, the scrambled bit is a fixed bit, and the processing module is configured to:

perform checking based on a scrambled bit value obtained through decoding and a scrambled bit value obtained in advance, where if the scrambled bit value obtained through decoding is different from the scrambled bit value obtained in advance, the check fails.

Optionally, the scrambling sequence is an RNTI of the sending device or a part of an RNTI or a sequence of repeated RNTIs.

Optionally, the scrambled bit set includes any one of the following sets:

a set including at least one of the fixed bits in descending order of reliability, starting from the highest;

a set including at least one of the fixed bits in ascending order of reliability, starting from the lowest;

a set including at least one of the fixed bits before an information bit;

a set including at least one of the fixed bits in descending order of row weights of a corresponding polar coding matrix, starting from the highest;

a set including at least one of the assistant bits in ascending order of positions, starting from the foremost;

a set including at least one of the assistant bits in descending order of reliability, starting from the highest;

a set including at least one of the assistant bits in ascending order of reliability, starting from the lowest;

a set including at least one of the assistant bits in descending order of row weights of a corresponding polar coding matrix, starting from the highest;

a set including at least one of the fixed bits and the assistant bits in ascending order of positions, starting from the foremost;

a set including at least one of the fixed bits and the assistant bits in ascending order of reliability, starting from the lowest;

a set including at least one of the fixed bits and the assistant bits in descending order of reliability, starting from the highest; and a set including at least one of the fixed bits and the assistant bits in descending order of row weights of a corresponding polar coding matrix, starting from the highest.

Optionally, the processing module is configured to:

determine positions of information bits, positions of the fixed bits, and positions of the assistant bits;

determine the scrambled bit set based on the positions of the fixed bits and/or the positions of the assistant bits; and perform polar decoding on the to-be-decoded sequence in sequence, check the scrambled bit when decoding the scrambled bit, and terminate the decoding if the check fails.

Optionally, the assistant bits include at least one of the following bits: a CRC bit, a PC bit, and a hash bit.

A sixth aspect of this application provides a coding apparatus, including:

a processing module, configured to determine positions of information bits and assistant bits and positions of fixed bits; where the processing module is further configured to determine a position of a to-be-scrambled bit based on the positions of the information bits and the assistant bits;

the processing module is further configured to allocate the information bits, the fixed bits, and the assistant bits in a to-be-coded sequence based on the position of the to-be-scrambled bit, the positions of the information bits and the assistant bits, and the positions of the fixed bits;

the processing module is further configured to: obtain a scrambling sequence, and scramble, based on the scrambling sequence, the to-be-scrambled bit to obtain a scrambled sequence; and the processing module is further configured to perform polar coding on the scrambled sequence to obtain a coded sequence; and a sending module, configured to send the coded sequence to a receiving device.

Optionally, the position of the to-be-scrambled bit includes any one of the following positions:

at least one of the positions of the information bits and the assistant bits in ascending order of positions, starting from the foremost;

at least one of the positions of the information bits and the assistant bits in descending order of reliability, starting from the highest;

at least one of the positions of the information bits and the assistant bits in ascending order of reliability, starting from the lowest; and at least one of the positions of the information bits and the assistant bits in descending order of row weights of a corresponding polar coding matrix, starting from the highest.

A seventh aspect of this application provides a sending device, including:

a memory, a processor, a transmitter, and a computer program, where the computer program is stored in the memory, and the processor runs the computer program to perform the coding method provided in any implementation of the first aspect or the third aspect.

In a specific implementation of the sending device, there is at least one processor that is configured to execute an executable instruction stored in the memory, namely, the computer program. Therefore, by exchanging data a receiving device by using a communications interface, the sending device performs the coding method provided in the first aspect, the third aspect, each implementation of the first aspect, or each implementation of the third aspect. Optionally, the memory may be further integrated in the processor.

An eighth aspect of this application provides a receiving device, including:

a memory, a processor, and a computer program, where the computer program is stored in the memory, and the processor runs the computer program to perform the decoding method provided in any implementation of the second aspect.

In a specific implementation of the receiving device, there is at least one processor that is configured to execute an executable instruction stored in the memory, namely, the computer program. Therefore, by exchanging data with a sending device by using a communications interface, the receiving device performs the decoding method provided in the second aspect or any implementation of the second aspect. Optionally, the memory may be further integrated in the processor.

A ninth aspect of this application provides a storage medium, configured to store a computer program, wherein the computer program is used to implement the coding method provided in any implementation of the first aspect or the third aspect.

A tenth aspect of this application provides a storage medium, configured to store a computer program, wherein the computer program is used to implement the decoding method provided in any implementation of the second aspect.

An eleventh aspect of this application provides a program product, where the program product includes a computer program (in other words, an executable instruction), and the computer program is stored in a readable storage medium. At least one processor of a sending device may read the computer program from the readable storage medium, and the at least one processor executes the computer program, so that the sending device implements the coding method provided in the first aspect, the third aspect, each implementation of the first aspect, or each implementation of the third aspect.

A twelfth aspect of this application provides a program product, where the program product includes a computer program (in other words, an executable instruction), and the computer program is stored in a readable storage medium. At least one processor of a receiving device may read the computer program from the readable storage medium, and the at least one processor executes the computer program, so that the receiving device implements the decoding method provided in the second aspect or each implementation of the second aspect.

According to the coding/decoding method, apparatus, and device provided in this application, the sending device configures corresponding bit values in the to-be-coded sequence based on the determined positions of the information bits, positions of the fixed bits, and positions of the assistant bits, in other words, configures all of the information hits, the fixed bits, and the assistant bits in the to-be-coded sequence. Then, the sending device obtains at least one bit from the fixed bits and/or the assistant bits as the to-be-scrambled bit set, determines the scrambling sequence, scrambles the bit in the to-be-scrambled bit set to obtain the scrambled sequence, and performs coding and subsequent processing for sending. A decoding device performs decoding and checking after receiving, detecting, and obtaining the to-be-decoded sequence. In the decoding process, when decoding a scrambled bit scrambled by the sending device, the decoding device checks, based on the bit value in the position that is obtained in advance in the scrambling sequence, the scrambled bit value in the position that is obtained through decoding, and if the check fails, does not need to decode a subsequent bit. In this way, a signal that does not come from the sending device is eliminated in advance, to shorten a decoding latency, and accelerate channel detection.

DESCRIPTION OF EMBODIMENTS

The technical solutions in the embodiments of this application may be applied to a 5G communications system or a future communications system, or may be applied to various other communications systems, for example, a Global System for Mobile Communications (GSM) system, a Code Division Multiple Access (CDMA) system, a Wideband Code Division Multiple Access (WCDMA) system, a general packet radio service (GPRS) system, a Long Term Evolution (LTE) system, an LTE frequency division duplex (FDD) system, an LTE time division duplex (TDD) system, and a Universal Mobile Telecommunications System (UMTS).

Figure 1:
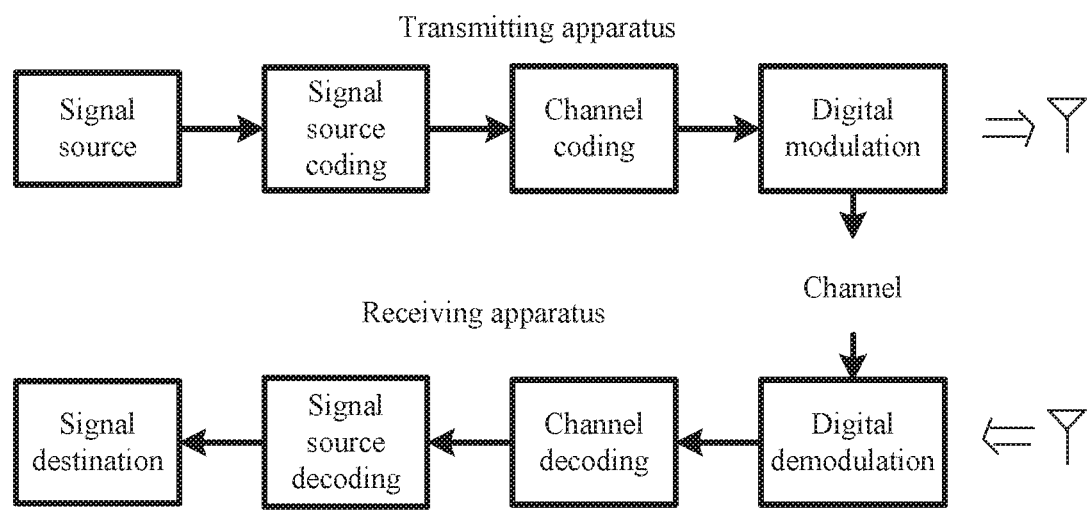
FIG. 1 is a basic schematic flowchart of common wireless communication.

FIG. 1 is a basic schematic flowchart of common wireless communication. As shown in FIG. 1, at a transmit end, a signal source successively undergoes signal source coding, channel coding, and digital modulation, and then is transmitted. At a receive end, a signal destination successively undergoes digital demodulation, channel decoding, and signal source decoding, and then is output. Polar coding may be used during channel coding. However, SC decoding, SCL decoding, or the like may be used during channel decoding. To improve performance of polar coding, many technologies improved based on polar coding, for example, CA-polar coding, PC-polar coding and CA+PC-polar, are also proposed currently.

Figure 2:
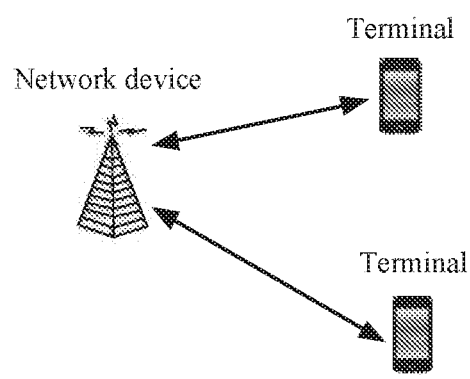
FIG. 2 is a schematic diagram of a system to which a coding method and a decoding method are applied according to this application.
Figure 3:
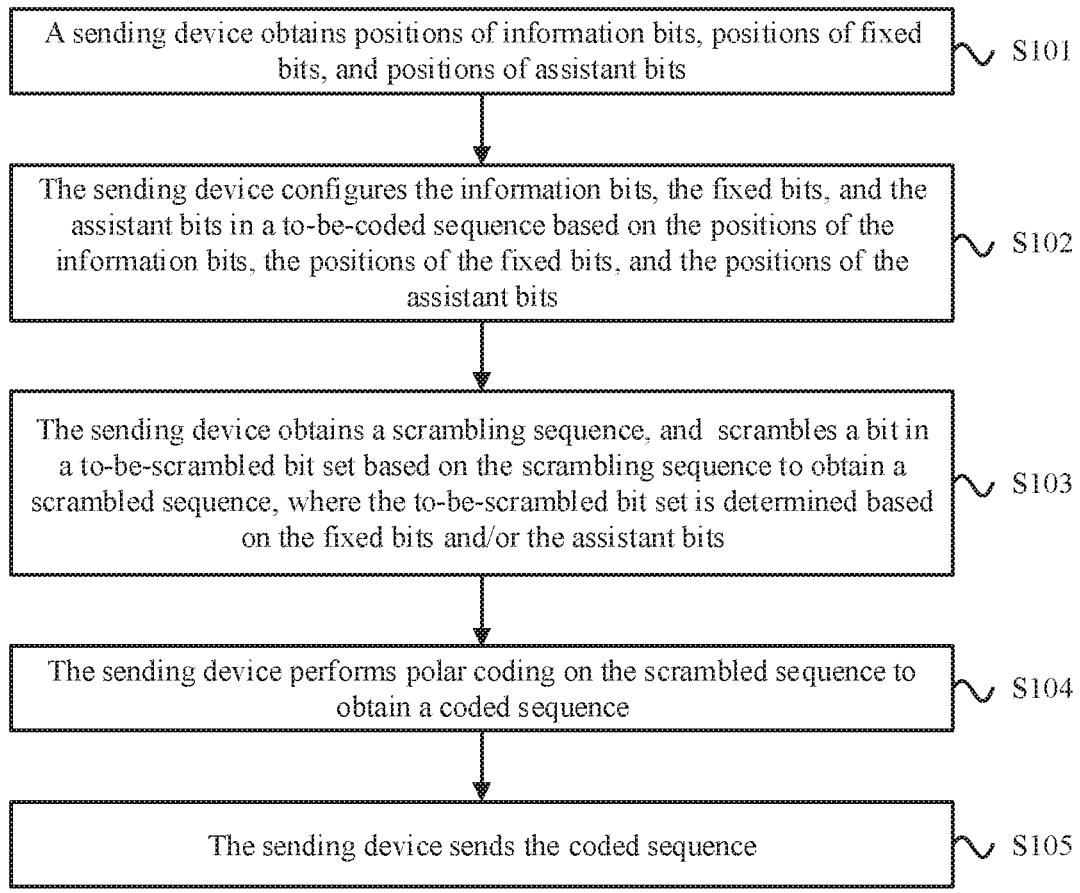
FIG. 3 is a flowchart of Embodiment 1 of a coding method according to this application.

FIG. 2 is a schematic diagram of a system to which a coding method and a decoding method are applied according to this application. As shown in FIG. 3, this solution is applied to a process of information interaction between a network device and a terminal. An encoder, namely, a sending device, may be either a network device or a terminal. Correspondingly, a decoder, namely, a receiving device, may be either a terminal or a network device. Optionally, this solution may be applied to a process of information interaction between terminals. In other words, both the sending device and the receiving device are terminals. This is not limited in this solution.

FIG. 3 is a flowchart of Embodiment 1 of a coding method according to this application. As shown in FIG. 3, this solution is applied to a transmitter, namely, a sending device. The sending device may be a network device or a terminal device. The coding method provided in this embodiment includes the following specific implementation steps.

S101. A sending device obtains positions of information bits, positions of fixed bits, and positions of assistant bits.

S102. The sending device configures the information bits, the fixed bits, and the assistant bits in a to-be-coded sequence based on the positions of the information bits, the positions of the fixed bits, and the positions of the assistant bits.

In the foregoing step, the sending device determines an initial sequence such as a construction sequence, and determines the positions of the information bits, the positions of the fixed bits, and the positions of the assistant bits in the initial sequence, to allocate corresponding bits in corresponding positions.

The assistant bits include at least one of the following bits: a cyclic redundancy check (CRC) bit, a parity check (PC) bit, and a hash bit. For example, the assistant bits include J CRC bits and J' assistant bits in total, and the J' assistant bits may be PC bits or CRC bits.

S103. The sending device obtains a scrambling sequence, and scrambles a bit in a to-be-scrambled bit set based on the scrambling sequence to obtain a scrambled sequence, where the to-be-scrambled bit set is determined based on the fixed bits and/or the assistant bits.

In this step, the sending device may first determine the to-be-scrambled bit set, or may first determine the scrambling sequence. This is not limited in this solution. The scrambling sequence is used to scramble a corresponding bit in the selected to-be-scrambled bit set.

The to-be-scrambled bit set includes at least one bit, and the at least one bit may be all fixed bits, or may be all assistant bits, or may be some fixed bits and some assistant bits. This is not limited in this solution. In a specific implementation of the to-be-scrambled bit set, the to-be-scrambled bit set may be any one of the following sets:

a set including at least one of the fixed bits in descending order of reliability, starting from the highest;

a set including at least one of the fixed bits in ascending order of reliability, starting from the lowest;

a set including at least one of the fixed bits before an information bit;

a set including at least one of the fixed bits in descending order of row weights of a corresponding polar coding matrix, starting from the highest (or a set including at least one of the fixed bits in descending order of Hamming weights of a corresponding polar coding matrix, starting from the highest);

a set including at least one of the assistant bits in ascending order of positions, starting from the foremost;

a set including at least one of the assistant bits in descending order of reliability, starting from the highest;

a set including at least one of the assistant bits in ascending order of reliability, starting from the lowest;

a set including at least one of the assistant bits in descending order of row weights of a corresponding polar coding matrix starting from the highest (or a set including at least one of the assistant bits in descending order of Hamming weights of a corresponding polar coding matrix, starting from the highest);

a set including at least one of the fixed bits and the assistant bits in ascending order of positions, starting from the foremost;

a set including at least one of the fixed bits and the assistant bits in ascending order of reliability, starting from the lowest;

a set including at least one of the fixed bits and the assistant bits in descending order of reliability, starting from the highest; and a set including at least one of the fixed bits and the assistant bits in descending order of row weights of a corresponding polar coding matrix, starting from the highest (or a set including at least one of the fixed bits and the assistant bits in descending order of Hamming weights of a corresponding polar coding matrix, starting from the highest).

The sending device may determine a specific to-be-scrambled bit set according to a solution negotiated with a receiving device or in a manner specified in a protocol, then separately scramble bits in the selected to-be-scrambled bit set, and allocate the scrambled bits in corresponding positions to obtain a scrambled sequence.

S104. The sending device performs polar coding on the scrambled sequence to obtain a coded sequence.

S105. The sending device transmits the coded sequence.

In the foregoing two steps, the sending device performs polar coding processing on the scrambled sequence to obtain the coded sequence for sending, so that the receiving device performs reception and detection.

In an actual implementation, rate matching may be further performed on the obtained coded sequence after the polar coding, then modulation is performed, and the coded sequence is mapped to a corresponding resource for sending.

In the coding method provided in this embodiment, the sending device configures corresponding bits in the to-be-coded sequence based on the determined positions of the information bits, positions of the fixed bits, and positions of the assistant bits, in other words, configures all of the information bits, the fixed bits, and the assistant bits in the to-be-coded sequence. Then, the sending device obtains at least one bit from the fixed bits and/or the assistant bits as the to-be-scrambled bit set, determines the scrambling sequence, scrambles the bit in the to-be-scrambled bit set to obtain the scrambled sequence, and performs coding and subsequent processing for sending. Therefore, in a decoding process, the receiving device may perform checking in advance based on the scrambled bit, and eliminate a signal that does not come from the sending device or a signal with a transmission error. In this way, a coding latency is shortened, and channel detection is accelerated.

Figure 4:
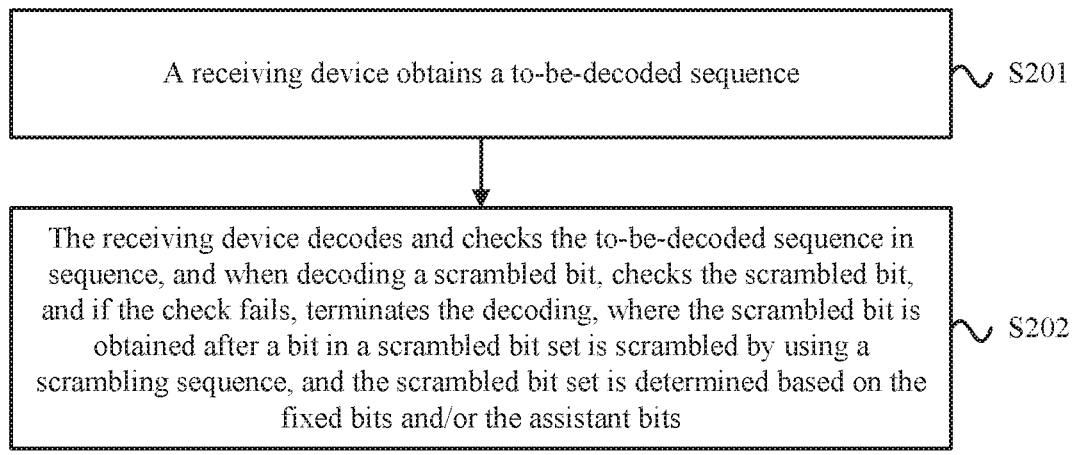
FIG. 4 is a flowchart of Embodiment 1 of a decoding method according to this application.

FIG. 4 is a flowchart of Embodiment 1 of a decoding method according to this application. As shown in FIG. 4, this solution is applied to a receiver, namely, a receiving device. The receiving device may be a network device or a terminal device. The decoding method provided in this embodiment includes the following specific implementation steps.

S201. A receiving device obtains a to-be-decoded sequence.

It should be noted that a descrambling operation at a receive end and a scrambling operation at a transmit end are a same operation in essence, and are both exclusive-OR operations performed on a scrambling sequence and an original sequence. Therefore, the two operations are not distinguished in this application, and scrambling is used for description.

In this step, the receiving device performs operations such as receiving, demapping, and demodulation to obtain a signal sent by a sending device, and then performs detection to obtain the to-be-decoded sequence. The sequence includes to-be-decoded information bits, fixed bits, and assistant bits, the assistant bits and/or the fixed bits include at least one bit scrambled by the sending device, and the scrambled bits constitute a scrambled bit set. In this solution, the assistant bits include at least one of the following bits: a CRC bit, a PC bit, and a hash bit. For example, the assistant bits include J CRC bits and J' assistant bits in total, and the J' assistant bits may be PC bits or CRC bits.

The receiving device determines positions of the information bits, positions of the fixed bits, and positions of the assistant bits in the to-be-decoded sequence. The determining manner is similar to that of the sending device.

The receiving device may determine the scrambled bit set based on the positions of the assistant bits and/or the positions of the fixed bits in the to-be-decoded sequence. All the bits in the scrambled bit set may be in the positions of the fixed bits, or may be in the positions of the assistant bits, or some are in the positions of the assistant bits and others are in the positions of the fixed bits. This is not limited in this solution. The positions of the bits in the scrambled bit set may be determined through negotiation between the transmit end and the receive end or specified in a protocol. In a specific implementation, the scrambled bit set includes any one of the following sets:

a set including at least one of the fixed bits in descending order of reliability, starting from the highest;

a set including at least one of the fixed bits in ascending order of reliability, starting from the lowest;

a set including at least one of the fixed bits before an information bit;

a set including at least one of the fixed bits in descending order of row weights of a corresponding polar coding matrix, starting from the highest (or a set including at least one of the fixed bits in descending order of Hamming weights of a corresponding polar coding matrix, starting from the highest);

a set including at least one of the assistant bits in ascending order of positions, starting from the foremost;

a set including at least one of the assistant bits in descending order of reliability, starting from the highest;

a set including at least one of the assistant bits in ascending order of reliability, starting from the lowest;

a set including at least one of the assistant bits in descending order of row weights of a corresponding polar coding matrix, starting from the highest (or a set including at least one of the assistant bits in descending order of Hamming weights of a corresponding polar coding matrix, starting from the highest);

a set including at least one of the fixed bits and the assistant bits in ascending order of positions, starting from the foremost;

a set including at least one of the fixed bits and the assistant bits in ascending order of reliability, starting from the lowest;

a set including at least one of the fixed bits and the assistant bits in descending order of reliability, starting from the highest; and a set including at least one of the fixed bits and the assistant bits in descending order of row weights of a corresponding polar coding matrix, starting from the highest (or a set including at least one of the fixed bits and the assistant bits in descending order of Hamming weights of a corresponding polar coding matrix, starting from the highest).

In the foregoing implementation, the fixed bits and the assistant bits are merely used to indicate positions in the to-be-decoded sequence, and the scrambled bit set is a set including a bit in any position in the to-be-decoded sequence.

S202. The receiving device decodes and checks the to-be-decoded sequence in sequence, and when decoding a scrambled bit, checks the scrambled bit, and if the check fails, terminates the decoding, where the scrambled bit is obtained after a bit in a scrambled bit set is scrambled by using a scrambling sequence, and the scrambled bit set is determined based on the fixed bits and/or the assistant bits.

In an optional implementation, if the scrambled bit is a fixed bit, the checking the scrambled bit includes:

performing checking based on a scrambled bit value obtained through decoding and a scrambled bit value obtained in advance, where if the scrambled bit value obtained through decoding is different from the scrambled bit value obtained in advance, the check fails.

It indicates that if the scrambled bit is a fixed bit, when the scrambled bit is decoded, checking is performed based on the scrambled bit value obtained through decoding and the scrambled bit value obtained in advance, and if the scrambled bit value obtained through decoding is different from the scrambled bit value obtained in advance, the decoding process is terminated. In this solution, the scrambled bit value obtained in advance is a value of the scrambled bit in the scrambling sequence.

A value of an assistant bit in a coding process is determined based on at least one information bit (sometimes another assistant bit needs to be added). Therefore, when the scrambled bit is an assistant bit, the receiving device needs to perform descrambling after performing decoding, then may perform checking after descrambling, and if the check fails, terminate the decoding.

In this step, the receiving device decodes the to-be-decoded sequence. In the decoding process, the receiving device considers the scrambled fixed bit and/or assistant bit as an information bit for decoding, and when decoding the scrambled bit, checks, based on the scrambled bit set determined in any one of the foregoing manners, the value of the scrambled bit obtained through decoding; and if the check fails, the receiving device terminates the decoding, in other words, does not decode a bit after the scrambled bit in the to-be-decoded sequence, but exits the decoding process and performs next detection.

If the scrambled bit value obtained in advance is the same as the scrambled bit value obtained through decoding in the position, the receiving device continues to decode a next bit in the to-be-decoded sequence, and performs a check in the foregoing manner every time a scrambled bit is decoded.

In the decoding method provided in this embodiment, a decoding device performs decoding and checking after receiving, detecting, and obtaining the to-be-decoded sequence. In the decoding process, when decoding a scrambled bit scrambled by the sending device, the decoding device checks, based on the bit value in the position that is obtained in advance in the scrambling sequence, the scrambled bit value in the position that is obtained through decoding, and if the check fails, the decoding is directly terminated, and there is no need to decode a subsequent bit. To be specific, in the decoding process, if the scrambled bit value obtained through decoding is different front the scrambled bit value obtained in advance, subsequent decoding is no longer performed. In this way, a signal that does not come from the sending device is eliminated in advance, to shorten a decoding latency, and accelerate channel detection.

Figure 5:
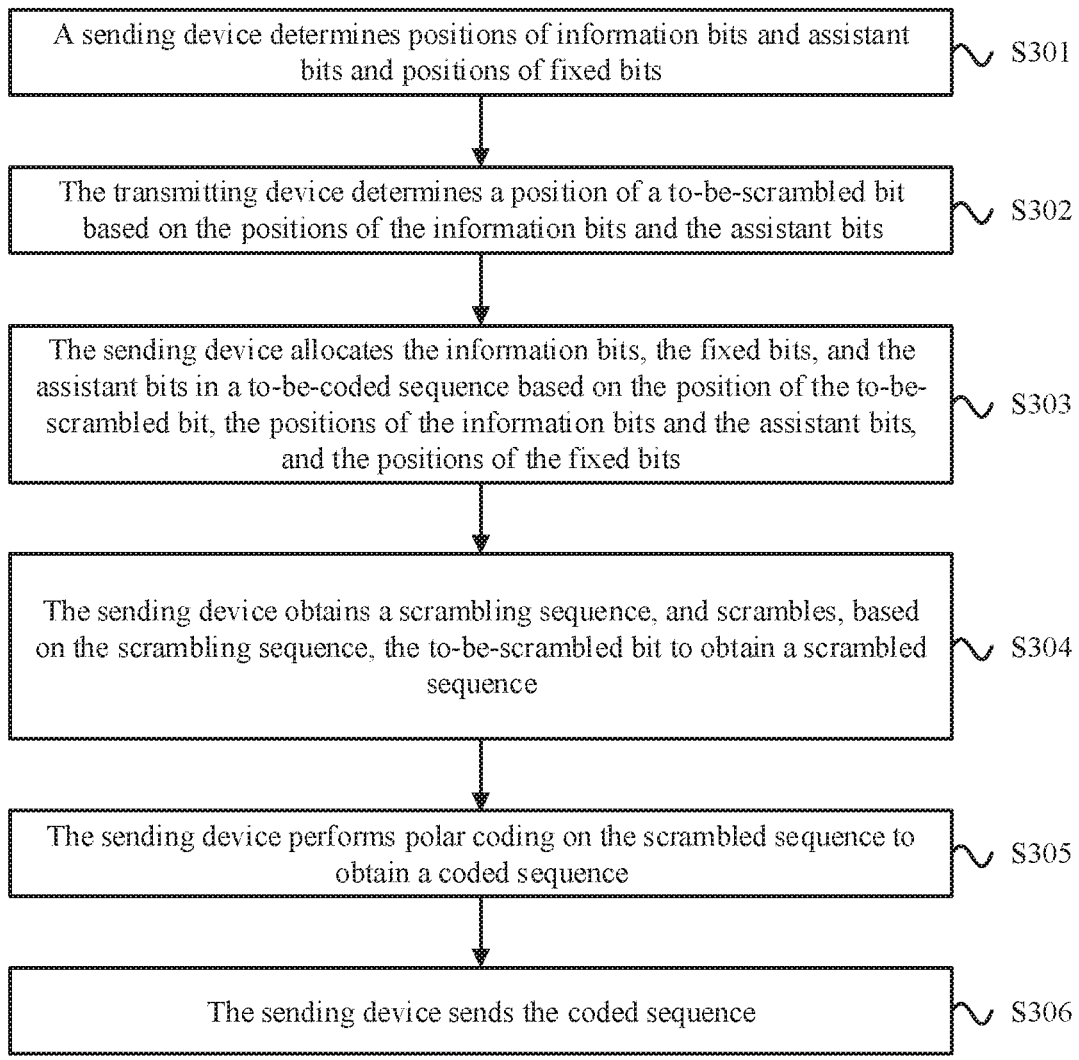
FIG. 5 is a flowchart of Embodiment 2 of a coding method according to this application.

FIG. 5 is a flowchart of Embodiment 2 of a coding method according to this application. As shown in FIG. 5, this embodiment further provides a coding method, applied to a transmit end. The method includes the following specific steps.

S301. A sending device determines positions of information bits and assistant bits and positions of fixed bits.

In this step, a difference from the embodiment shown in FIG. 3 lies in that, in this solution, after the sending device determines an initial sequence (namely, an initial construction sequence), the sending device determines the positions of the fixed bits and the positions of the assistant bits and the information bits based on parameters such as a quantity of information bits and a coding length. In other words, only general positions of all the assistant bits and all the information bits need to be determined, and specific positions of the information bits do not need to be determined in detail. The information bits may be determined after subsequent scrambling is completed.

S302. The sending device determines a position of a to-be-scrambled bit based on the positions of the information bits and the assistant bits.

In this step, the sending device first selects, from the positions of the information bits and the assistant bits, the position of the to-be-scrambled bit according to a rule. In a specific implementation, the position of the to-be-scrambled bit includes any one of the following positions:

at least one of the positions of the information bits and the assistant its in ascending order of positions, starting from the foremost;

at least one of the positions of the information bits and the assistant bits in descending order of reliability, starting from the highest;

at least one of the positions of the information bits and the assistant bits in ascending order of reliability, starting from the lowest; and at least one of the positions of the information bits and the assistant bits in descending order of row weights of a corresponding polar coding matrix, starting from the highest (at least one of the positions of the information bits and the assistant bits in descending order of Hamming weights of a corresponding polar coding matrix, starting from the highest).

In a specific implementation of this solution, a receiving device also determines a position of a scrambled bit in a same manner as the sending device, to determine scrambled bits in a subsequent decoding process.

S303. The sending device configures the information bits, the fixed bits, and the assistant bits in a to-be-coded sequence based on the position of the to-be-scrambled bit, the positions of the information bits and the assistant bits, and the positions of the fixed bits.

In this step, the sending device determines the positions of the assistant bits and the positions of the information bits based on the determined position of the to-be-scrambled bit. In an implementation, the positions of the assistant bits include positions of all to-be-scrambled bits. In other words, only one or more bits in the assistant bits are scrambled, and the information bits are not scrambled. In another implementation, positions of to-be-scrambled bits not only include the positions of the assistant bits but also include the positions of the information bits. In other words, some (or all) information bits and some (or all) assistant bits are scrambled. In another implementation, the positions of the information bits include positions of all to-be-scrambled bits. In other words, the information bits are subsequently scrambled.

After positions of other bits are determined, the information bits, the fixed bits, and the assistant bits are configured in corresponding positions.

S304. The sending device obtains a scrambling sequence, and scrambling, based on the scrambling sequence, the to-be-scrambled bit to obtain a scrambled sequence.

In this step, the sending device selects a proper scrambling sequence, and then scrambles, based on the scrambling sequence, the bit corresponding to the position of the selected to-be-scrambled bit to obtain the scrambled sequence.

S305. The sending device performs polar coding on the scrambled sequence to obtain a coded sequence.

S306. The sending device sends the coded sequence.

In the foregoing step, the sending device performs polar coding on the scrambled sequence, and if processing such as rate matching is further required, performs corresponding processing, then performs modulation, and maps the sequence to a corresponding resource for sending.

In the coding method provided in this embodiment, the sending device scrambles on at least one bit in the assistant bits and the information bits based on the selected scrambling sequence, and then performs coding and sending. The receiving device determines the position of the scrambled bit in the to-be-decoded sequence in a same manner as the sending device. In the decoding process, when decoding the scrambled bit, the receiving device performs checking, and determines in advance whether the information is information of the sending device or determines in advance whether a transmission error occurs, to effectively shorten a decoding latency, and accelerate channel detection.

Based on the foregoing several embodiments, the coding method and decoding method provided in this application are described below in detail by using some specific implementations.

Figure 6:
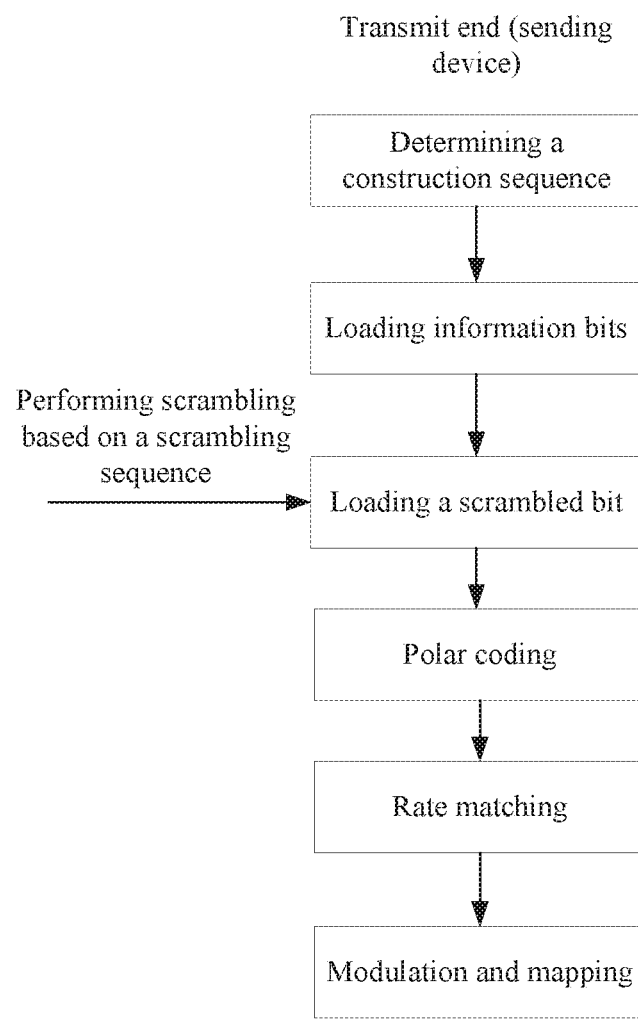
FIG. 6 is a schematic flowchart of polar code-based coding performed by a transmit end according to this application.
Figure 7:
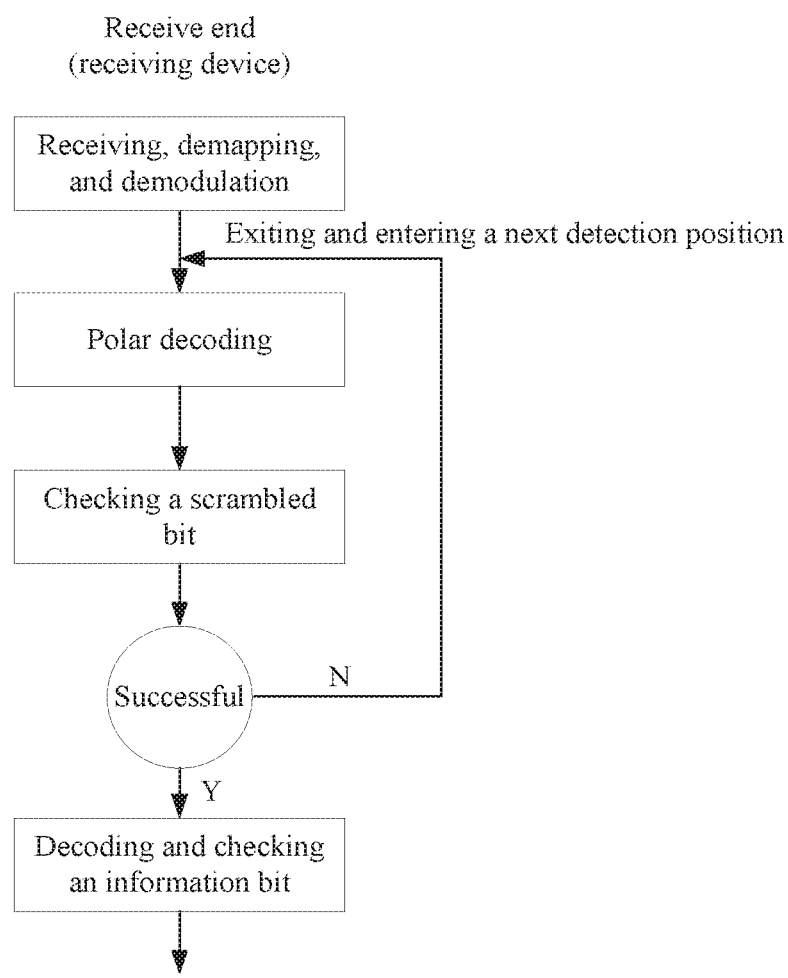
FIG. 7 is a schematic flowchart of polar code-based decoding performed by a receive end according to this application.

FIG. 6 is a schematic flowchart of polar code-based coding performed by a transmit end according to this application. FIG. 7 is a schematic flowchart of polar code-based decoding performed by a receive end according to this application.

As shown in FIG. 6, a sending device determines a construction sequence, determines positions of information bits, positions of fixed bits, and positions of other assistant bits based on the construction sequence, configures the corresponding information bits, and loads the corresponding bits in the positions of the fixed bits and the positions of the assistant bits (the assistant bits and/or the fixed bits include to-be-scrambled bits). The sending device determines a scrambling sequence and a to-be-scrambled bit set, and scrambles a bit in the to-be-scrambled bit set based on the determined scrambling sequence to obtain a scrambled bit. Then, the sending device configures the obtained scrambled bit in a corresponding position, performs polar coding, rate matching, and modulation, and maps the sequence to a corresponding resource for sending.

As shown in FIG. 7, a receiving device determines positions of information bits, positions of assistant bits, and positions of fixed bits based on a construction sequence, determines a position of a scrambled bit in a to-be-decoded sequence in a same manner as a sending device, and determines a scrambling sequence. In a process of performing polar decoding on the to-be-decoded sequence, the receiving device decodes the determined scrambled bit as an information bit, and when decoding a position of the scrambled bit, performs checking based on a decoding result and a bit in the scrambling sequence. To be specific, every time a scrambled bit is decoded, the scrambled bit and a bit obtained in advance in a corresponding position in the scrambling sequence need to be compared for checking. If the check succeeds, the receiving device continues decoding; otherwise, if the check fails, the receiving device exits decoding and performs next detection until detection of all received data is completed.

Based on the coding and decoding procedures shown in FIG. 6 and FIG. 7, assuming that the sending device is UE, the following describes the coding method and the decoding method in this application by using some specific implementations.

First Implementation: To-Be-Scrambled Bits are Several Fixed Bits of the Highest Reliability.

A specific process of implementing coding and sending by the sending device is as follows:

(1) Determine an initial construction sequence (with a length of N) $Q_1^N$ of polar codes, where the construction sequence is a sequence of polar-code polarized channels sorted based on relative reliability under a mother code length. The sequence may be obtained in a manner of table lookup or a manner of online calculation or a manner of half table lookup and half calculation. For example, an initial construction sequence with a code length of 64 is $Q_1^{64}$=[1, 2, 3, 5, 17, 4, 33, 6, 7, 10, 11, 18, 13, 19, 34, 21, 35, 8, 25, 37, 12, 41, 14, 20, 15, 49, 22, 36, 23, 26, 38, 27, 39, 42, 29, 43, 16, 50, 45, 51, 24, 53, 28, 40, 57, 30, 44, 31, 46, 52, 47, 54, 55, 58, 59, 32, 61, 48, 56, 60, 62, 63, 64].

(2) Determine an information bit set, a fixed bit set, a punctured/shortened bit set, and an assistant bit set based on a quantity K of information bits, a coding code length M, a rate matching mode, and the initial construction sequence. For example, when K=32, and a code rate is ½, several fixed bits (for example, 16 fixed bits are selected herein) of the highest reliability are selected as a to-be-scrambled fixed bit set, that is, a position of a to-be-scrambled bit is at least one bit of the highest reliability in the fixed bits. When the information bit set is $I_1^{32}$=[127, 39, 42, 29, 43, 16, 50, 45, 51, 24, 53, 28, 40, 57, 30, 44, 31, 46, 52, 47, 54, 55, 59, 32, 61, 48, 56, 60, 62, 63, 64], and the fixed bit set is $F_1^{32}$=[1, 2, 3, 5, 9, 17, 4, 33, 6, 7, 10, 11, 18, 13, 19, 34, 21, 35, 8, 25, 37, 12, 41, 14, 20, 15, 49, 22, 36, 23, 26, 38], a fixed bit set (that is, a to-be-scrambled bit set) of 16 bits in descending order of reliability, starting from the highest, is:

$F'_1{}^{16}$=[21, 35, 8, 25, 37, 12, 41, 14, 20, 15, 49, 22, 36, 23, 26, 38], and the punctured/shortened bit set is ⌊ ⌋.

(3) When the sending device is user equipment (UE), a 16-bit radio network temporary identifier (RNTI) of a user may be selected as a scrambling sequence, and scrambling is performed in positions of to-be-scrambled bits, where the positions of the to-be-scrambled bits are 16 fixed bit positions determined in $F'_1{}^{16}$. A specific scrambling manner may be: performing an exclusive-OR operation on the scrambling sequence and the to-be-scrambled bit set corresponding to the positions of the to-be-scrambled bits, and filling in corresponding positions in the sequence with obtained values to obtain a scrambled sequence. Generally, the RNTI itself is used as a scrambling sequence, or a part of the RNTI or a sequence of repeated RNTIs may be used as a scrambling sequence. Without loss of generality, this application is still described by using the RNTI itself as a scrambling sequence.

(4) Finally, the sending device performs polar coding on the scrambled sequence, and sends a coded sequence, namely, coded bits.

A specific process of implementing decoding and checking by the receiving device is as follows:

(1) Determine an initial construction sequence (with a length of N) $Q_1^N$ of polar codes, where the construction sequence is a sequence of polar-code polarized channels sorted based on relative reliability under a mother code length. The sequence may be obtained in a manner of table lookup or a manner of online calculation or a manner of half table lookup and half calculation.

(2) Determine an information bit set, a fixed bit set, a punctured/shortened bit set, and an assistant bit set based on a quantity K of information bits, a coding code length M, a rate matching mode, and the initial construction sequence.

(3) Decode scrambled fixed bits as information bits, where a generated to-be-decoded information hit set (namely, a to-be-decoded sequence) is:

$I'_1{}^{43}=I_1{}^{32}+F'_1{}^{16}$=[21, 35, 8, 25, 37, 12, 41, 14, 20, 15, 49, 22, 36, 23, 26, 38, 27, 39, 42, 29, 43, 16, 50, 45, 51, 24, 53, 28, 40, 57, 30, 44, 31, 46, 52, 47, 54, 55, 58, 59, 32, 61, 48, 56, 60, 62, 63, 64].

(4) in a process of decoding the to-be-decoded sequence, based on a determined scrambled bit set, every time a position of a scrambled fixed bit is decoded, the receiving device compares a scrambled bit value obtained through decoding with a value in a corresponding position in a scrambling sequence (which may be an RNTI of UE) for checking, determines whether the two values are consistent, and if the two values are consistent, determines whether the information comes from the sending device (namely, the UE), and continues decoding; otherwise, exits decoding and performs next detection.

Second Implementation: To-Be-Scrambled Bits are Several Fixed Bits Before a First Information Bit.

A specific process of implementing coding and sending by the sending device is as follows:

(1) The sending device determines an initial construction sequence (with a length of N) $Q_1^N$ of polar codes, where the construction sequence is a sequence of polar-code polarized channels sorted based on relative reliability under a mother code length. The sequence may be obtained in a manner of table lookup or a manner of online calculation or a manner of half table lookup and half calculation. For example, an initial construction sequence with a code length of 64 is $Q_1^{64}$=[1, 2, 3, 5, 9, 17, 4, 33, 6, 7, 10, 11, 18, 13, 19, 34, 21, 35, 8, 25, 37, 12, 41, 14, 20, 15, 49, 22, 36, 23, 26, 38, 27, 39, 42, 29, 43, 16, 50, 45, 51, 24, 53, 28, 40, 57, 30, 44, 31, 46, 52, 47, 54, 55, 58, 59, 32, 61, 48, 56, 60, 62, 63, 64].

(2) Determine an information bit set, a fixed bit set, a punctured/shortened bit set, and an assistant bit set based on a quantity K of information bits, a coding code length M, a rate matching mode, and the initial construction sequence. For example, when K=32, and a code rate is ½, several fixed bits (for example, 16 fixed bits are selected herein) before a first information bit are selected as a to-be-scrambled fixed bit set, where the fixed bits may be consecutive or distributed (for example, 16 fixed bits with a maximum natural order before the first information bit are selected herein). In this case, the information bit set is $I_1{}^{32}$=[27, 39, 42, 29, 43, 16, 50, 45, 51, 24, 53, 28, 40, 57, 30, 44, 31, 46, 52, 47, 54, 55, 58, 59, 32, 61, 48, 56, 60, 62, 63, 64];

the fixed bit set is $F_1{}^{32}$=[1, 2, 3, 5, 9, 17, 4, 33, 6, 7, 10, 11, 18, 13, 19, 34, 21, 35, 8, 25, 37, 12, 41, 14, 20, 15, 49, 22, 36, 23, 26, 38];

a set of 16 fixed bits before the first information bit is $F'_1{}^{16}$=[21, 35, 8, 25, 37, 12, 41, 14, 20, 15, 49, 22, 36, 23, 26, 38]; and the punctured/shortened bit set is [].

(3) When the sending device is UE, an RNTI may be selected as a scrambling sequence, and scrambling is performed in positions of to-be-scrambled bits, where the positions of the to-be-scrambled bits are 16 fixed bit positions determined in $F'_1{}^{16}$. A specific scrambling manner may be: performing an exclusive-OR operation on the scrambling sequence and the to-be-scrambled bit set corresponding to the positions of the to-be-scrambled bits, and filling in corresponding positions in the sequence with obtained values to obtain a scrambled sequence.

(4) Finally, the sending device performs polar coding on e scrambled sequence, and sends a coded sequence, namely, coded bits.

A specific process of implementing decoding and checking by the receiving device is as follows:

(1) The receiving device determines an initial construction sequence (with a length of N) $Q_1^N$ of polar codes, where the construction sequence is a sequence of polar-code polarized channels sorted based on relative reliability under a mother code length. The sequence may be obtained in a manner of table lookup or a manner of online calculation or a manner of half table lookup and half calculation.

(2) Determine an information bit set, a fixed bit set, a punctured/shortened bit set, and an assistant bit set based on a quantity K of information bits, a coding code length M, a rate matching mode, and the initial construction sequence.

(3) Decode scrambled fixed bits as information bits, where a generated to-be-decoded information bit set (that is, a to-be-decoded sequence) is:

$I'_1{}^{43}=I_1{}^{32}+F'_1{}^{16}$=[21, 35, 8, 25, 37, 12, 41, 14, 20, 15, 49, 22, 36, 23, 26, 38, 27, 39, 42, 29, 43, 16, 50, 45, 51, 24, 53, 28, 40, 57, 30, 44, 31, 46, 52, 47, 54, 55, 58, 59, 32, 61, 48, 56, 60, 62, 63, 64].

(4) In a process of decoding the to-be-decoded sequence, based on a determined scrambled bit set, every time a position of a scrambled fixed bit is decoded, the receiving device compares a scrambled bit value obtained through decoding with a value in a corresponding position in a scrambling sequence (which may be an RNTI of UE) for checking, determines whether the two values are consistent, and if the two values are consistent, determines whether the information comes from the sending device (namely, the UE), and continues decoding; otherwise, exits decoding and performs next detection.

Third Implementation: To-Be-Scrambled Bits are Several Fixed Bits of the Lowest Reliability in Fixed Bits.

A specific process of implementing coding and sending by the sending device is as follows:

(1) Determine an initial construction sequence (with a length of N) $Q_1^N$ of polar codes, where the construction sequence is a sequence of polar-code polarized channels sorted based on relative reliability under a mother code length.

(2) Determine an information bit set, a fixed bit set, a punctured/shortened bit set, and an assistant bit set based on a quantity K of information bits, a coding code length M, a rate matching mode, and the initial construction sequence; and select several fixed bits of low reliability as a to-be-scrambled fixed bit set, that is, a position of a to-be-scrambled bit is at least one bit of the lowest reliability in the fixed bits.

(3) Select an RNTI of a user as a scrambling sequence, and perform scrambling in positions of to-be-scrambled bits, where the positions of the to-be-scrambled bits are 16 fixed bit positions determined in $F'_1{}^{16}$. A specific scrambling manner may be: performing an exclusive-OR operation on the scrambling sequence and the to-be-scrambled bit set corresponding to the positions of the to-be-scrambled bits, and filling in corresponding positions in the sequence with obtained values to obtain a scrambled sequence.

(4) Finally, the sending device performs polar coding on the scrambled sequence, and sends a coded sequence, namely, coded bits, A specific process of implementing decoding and checking by the receiving device is as follows:

(1) The receiving device determines an initial construction sequence (with a length of N) $Q_1^N$ of polar in a same manner as the sending device, where the construction sequence is a sequence of polar-code polarized channels sorted based on relative reliability under a mother code length. The sequence may be obtained in a manner of table lookup or a manner of online calculation or a manner of half table lookup and half calculation.

(2) Determine an information bit set, a fixed bit set, a punctured/shortened bit set, and an assistant bit set based on a quantity K of information bits, a coding code length M, a rate matching mode, and the initial construction sequence. In this solution, the receiving device determines a scrambled bit set in a same manner as the sending device, that is, positions of scrambled bits (several fixed bits of the lowest reliability).

(3) Decode the scrambled fixed bits as information bits, in other words, generate a to-be-decoded information bit set (namely, a to-be-decoded sequence).

(4) In a process of decoding the to-be-decoded sequence, based on the determined scrambled bit set, every time a position of a scrambled fixed bit is decoded, the receiving device compares a scrambled bit value obtained through decoding with a value in a corresponding position in a scrambling sequence (which may be an RNTI of UE) for checking, determines whether the two values are consistent, and if the two values are consistent, determines whether the information comes from the sending device (namely, the UE), and continues decoding; otherwise, exits decoding and performs next detection.

Fourth Implementation: To-Be-Scrambled Bits are Several Fixed Bits in Foremost Positions in Fixed Bits.

A specific implementation process of this manner is similar to those of the foregoing several manners. For determining a to-be-scrambled bit set by the sending device or determining a scrambled bit set by the receiving device, several fixed bits in foremost positions in a sequence are selected from a fixed bit set. Specific scrambling, coding, decoding, and checking processes are consistent with those in the foregoing solutions.

Fifth Implementation: To-Be-Scrambled Bits are Several Bits in Fixed Bits in Descending Order of Row Weights or Hamming Weights of a Corresponding Polar Coding Matrix, Starting from the Highest.

A specific implementation process of this manner is similar to those of the foregoing several manners. For determining a to-be-scrambled bit set by the sending device or determining a scrambled bit set by the receiving device, several fixed bits of the highest row weights or Hamming weights of a corresponding polar coding matrix in a sequence are selected from a fixed bit set. Specific scrambling, coding, decoding, and checking processes are consistent with those in the foregoing solutions.

Sixth Implementation: To-Be-Scrambled Bits are Several Assistant Bits in Foremost Positions in Assistant Bits.

A specific process of implementing coding and sending by the sending device is as follows:

(1) The sending device determines an initial construction sequence (with a length of N) $Q_1^N$ of polar codes, where the construction sequence is a sequence of polar-code polarized channels sorted based on relative reliability under a mother code length.

(2) Determine an information bit set, a fixed bit set, a punctured/shortened bit set, and an assistant bit set based on a quantity K of information bits, a coding code length M, a rate matching mode, and the initial construction sequence. The sending device determines several bits in foremost positions in assistant bits as a to-be-scrambled bit set, that is, positions of to-be-scrambled bits are several foremost positions in the positions of the assistant bits.

(3) Select an KNIT of a user as a scrambling sequence, and perform scrambling in the positions of the to-be-scrambled bits. A specific scrambling manner may be: performing an exclusive-OR operation on the scrambling sequence and the to-be-scrambled bit set corresponding to the positions of the to-be-scrambled bits, and filling in corresponding positions in the sequence with obtained values to obtain a scrambled sequence.

(4) Finally, the sending device performs polar coding on the scrambled sequence, and sends a coded sequence, namely, coded bits.

A specific process of implementing decoding and checking by the receiving device is as follows:

(1) Determine an initial construction sequence (with a length of N) $Q_1^N$ of polar codes, where the construction sequence is a sequence of polar-code polarized channels sorted based on relative reliability under a mother code length. The sequence may be obtained in a manner of table lookup or a manner of online calculation or a manner of half table lookup and half calculation.

(2) Determine an information bit set, a fixed bit set, a punctured/shortened bit set, and an assistant bit set based on a quantity K of information bits, a coding code length M, a rate matching mode, and the initial construction sequence; and determine a scrambled bit set in assistant bits in a same manner as the sending device.

(3) Decode scrambled assistant bits as information bits, in other words, generate a to-be-decoded information bit set (namely, a to-be-decoded sequence).

(4) In a process of decoding the to-be-decoded sequence, based on the determined scrambled bit set, every time a scrambled assistant bit is decoded, the receiving device needs to perform descrambling after decoding, and may perform checking only after descrambling. The receiving device determines, based on a check result, whether the information comes from the sending device (namely, the UE), and if the check succeeds, continues decoding; otherwise, exits decoding and performs next detection.

Seventh Implementation: To-Be-Scrambled Bits are Several Assistant Bits of the Highest Reliability in Assistant Bits.

A specific process of implementing coding and sending by the sending device is as follows:

(1) The sending device determines an initial construction sequence (with a length of N) $Q_1^N$ of polar codes, where the construction sequence is a sequence of polar-code polarized channels sorted based on relative reliability under a mother code length.

(2) Determine an information hit set, a fixed hit set, a punctured/shortened bit set, and an assistant bit set based on a quantity K of information bits, a coding code length M, a rate matching mode, and the initial construction sequence. The sending device determines several bits in descending order of reliability, starting from the highest in assistant bits as a to-be-scrambled bit set, that is, positions of to-be-scrambled bits are several positions of the highest reliability in positions of the assistant bits.

(3) Select an RNTI of a user as a scrambling sequence, and perform scrambling in the positions of the to-be-scrambled bits. A specific scrambling manner may be: performing an exclusive-OR operation on the scrambling sequence and the to-be-scrambled bit set corresponding to the positions of the to-be-scrambled bits, and filling in corresponding positions in the sequence with obtained values to obtain a scrambled sequence.

(4) Finally, the sending device performs polar coding on the scrambled sequence, and sends a coded sequence, namely, coded bits.

A specific process of implementing decoding and checking by the receiving device is as follows:

(1) Determine an initial construction sequence (with a length of N) $Q_1^N$ of polar codes, where the construction sequence is a sequence of polar-code polarized channels sorted based on relative reliability under a mother code length. The sequence may be obtained in a manner of table lookup or a manner of online calculation or a manner of half table lookup and half calculation.

(2) Determine an information bit set, a fixed bit set, a punctured/shortened bit set, and an assistant bit set based on a quantity K of information bits, a coding code length M, a rate matching mode, and the initial construction sequence; and determine a scrambled bit set in assistant bits in a same manner as the sending device.

(3) Decode scrambled assistant bits as information bits, in other words, generate a to-be-decoded information bit set (namely, a to-be-decoded sequence).

(4) In a process of decoding the to-be-decoded sequence, based on the determined scrambled bit set, every time a scrambled assistant bit is decoded, the receiving device needs to perform descrambling after decoding, and may perform checking only after descrambling. The receiving device determines, based on a check result, whether the information comes from the sending device (namely, the UE), and if the check succeeds, continues decoding; otherwise, exits decoding and performs next detection.

Eighth Implementation: To-Be-Scrambled Bits are Several Assistant Bits of the Lowest Reliability in Assistant Bits.

A specific implementation process of this manner is similar to those of the foregoing manners. For determining a to-be-scrambled bit set by the sending device or determining a scrambled bit set by the receiving device, several assistant bits of the lowest reliability are selected from an assistant bit set. Specific scrambling, coding, decoding, and checking processes are consistent with those in the foregoing solutions.

Ninth Implementation: To-Be-Scrambled Bits are Several Bits in Assistant Bits in Descending Order of Row Weights or Hamming Weights of a Corresponding Polar Coding Matrix, Starting from the Highest.

A specific implementation process of this manner is similar to those of the foregoing manners. For determining a to-be-scrambled bit set by the sending device or determining a scrambled bit set by the receiving device, several assistant bits in descending order of row weights or Hamming weights of a corresponding polar coding matrix, starting from the highest are selected from an assistant bit set. Specific scrambling, coding, decoding, and checking processes are consistent with those in the foregoing solutions.

In addition to the foregoing nine implementations, in a specific application, the sending device and the receiving device may further determine, from a union set of fixed bits and assistant bits, a to-be-scrambled bit set or a scrambled bit set. The to-be-scrambled bit set or the scrambled bit set may be any one of the following:

a set including at least one of the fixed bits and the assistant bits in ascending order of positions, starting from the foremost; a set including at least one of the fixed bits and the assistant bits in ascending order of reliability, starting from the lowest; a set including at least one of the fixed bits and the assistant bits in descending order of reliability, starting from the highest; and a set including at least one of the fixed bits and the assistant bits in descending order of row weights of a corresponding polar coding matrix, starting from the highest.

A manner in which the sending device performs scrambling and coding processing after determining the to-be-scrambled bit set, and then maps a sequence to a corresponding resource for sending is similar to those of the foregoing solutions, and is not described herein again. Likewise, a manner in which the receiving device performs decoding and checking after scrambling the bit set is similar to those in the foregoing solutions, and is not described herein again.

Tenth implementation: In addition to determining positions of scrambled bits from assistant bits and/or fixed hits described above, the sending device may further determine positions of to-be-scrambled bits from positions of information hits and assistant bits, and the receiving device may further determine positions of scrambled bits from positions of information hits and assistant bits. Using the sending device as an example, determining positions of to-be-scrambled bits includes the following several manners:

The positions of the to-be-scrambled bits are some of the positions of the information bits and the assistant bits in ascending order of positions, starting from the foremost; the positions of the to-be-scrambled bits are some of the positions of the information bits and the assistant bits in descending order of reliability, starting from the highest; the positions of the to-be-scrambled bits are some of the positions of the information bits and the assistant bits in ascending order of reliability, starting from the lowest; and the positions of the to-be-scrambled bits are some of the positions of the information bits and the assistant bits in descending order of row weights or Hamming weights of a corresponding polar coding matrix, starting from the highest.

Assuming that the positions of the to-be-scrambled bits are some of the positions of the information bits and the assistant bits in ascending order of positions, starting from the foremost, a specific implementation of a coding method of the sending device is as follows:

(1) The sending device determines an initial construction sequence (with a length of N) $Q_1^N$ of polar codes, where the construction sequence is a sequence of polar-code polarized channels sorted based on relative reliability under a mother code length.

(2) Determine positions of information bits and assistant bits based on a quantity K of information bits, a coding code length M, a rate matching mode, and the initial construction sequence, use some of the positions of all the information bits and the assistant bits in ascending order of positions, starting from the foremost, as positions of to-be-scrambled bits, determine positions of information bits in positions other than the positions of the to-be-scrambled bits in the positions of all the information bits and the assistant bits, determine an information bit set, a fixed bit set, a punctured/shortened bit set, and an assistant bit set, and allocate corresponding bits.

(3) Select an RNTI of a user as a scrambling sequence, and perform scrambling in the positions of the to-be-scrambled bits. A specific scrambling manner may be: performing an exclusive-OR operation on the scrambling sequence and the to-be-scrambled bit set corresponding to the positions of the to-be-scrambled bits, and filling in corresponding positions in the sequence with obtained values to obtain a scrambled sequence.

(4) Finally, the sending device performs polar coding on the scrambled sequence, and sends a coded sequence, namely, coded bits.

A specific implementation of a decoding method on the receiving device is as follows:

(1) Determine initial construction sequence (with a length of N) $Q_1^N$ of polar codes, where the construction sequence is a sequence of polar-code polarized channels sorted based on relative reliability under a mother code length. The sequence may be obtained in a manner of table lookup or a manner of online calculation or a manner of half table lookup and half calculation.

(2) Determine an information bit set, a fixed bit set, a punctured/shortened bit set, and an assistant bit set based on a quantity K of information bits, a coding code length M, a rate matching mode, and the initial construction sequence; and determine a scrambled bit set in a same manner as the sending device, in other words, determine bits corresponding to several foremost positions in all bit positions including the information bits and assistant bits, as the scrambled bit set.

(3) Decode scrambled assistant bits as information bits, in other words, generate a to-be-decoded information bit set (namely, a to-be-decoded sequence).

(4) In a process of decoding the to-be-decoded sequence, based on the determined scrambled bit set, every time a position of a scrambled assistant bit is decoded, the receiving device needs to perform descrambling after decoding, and may perform checking only after descrambling. The receiving device determines, based on a check result, whether the information comes from the sending device (namely, the UE), and if the check succeeds, continues decoding; otherwise, exits decoding and performs next detection.

Other manners of determining the positions of the scrambled bits in the positions of the information bits and the assistant bits are similar to those in the forgoing implementations, and are not described herein again.

Eleventh Implementation

A specific implementation of a coding method on the sending device is:

(1) Determine initial construction sequence (with a length of N) $Q_1^N$ of polar codes, where the construction sequence is a sequence of polar-code polarized channels sorted based on relative reliability under a mother code length.

(2) Determine an information bit set, a fixed bit set (K), a punctured/shortened bit set, and an assistant bit set based on a quantity K of information bits, a coding code length M, a rate matching mode, and the initial construction sequence.

(3) Select an RNTI of a user as a scrambling sequence, and perform scrambling in positions of the to-be-scrambled bits, where the positions of the to-be-scrambled bits are integer$(P_1*K)^{th}$, integer$(P_2*K)^{th}$, . . . , and integer$(P_{J'}*K)^{th}$ positions in a union set (K'=K+J') of information bits and assistant bits. In this solution, several bits are still selected from all bit positions of the information bits and the assistant bits as the positions of the to-be-scrambled bits according to an algorithm, and this implementation is not limited to the Integer(X) algorithm.

(a) $P_1$, $P_2$, . . . , and $P_{J'}$ are proportions of scrambled bits in the positions in "the union set of the information bits and the assistant bits". For example, J'=3, $P_1$=40%, $P_2$=50%, and $P_3$=60%; or $P_1$=3/8, $P_2$=1/2, and $P_3$=5/8.

(b) Integer(X) means rounding X, which may be rounding down, rounding off, or rounding up.

(4) Finally, the sending device performs polar coding on the scrambled sequence, and sends a coded sequence, namely, coded bits.

A specific implementation of a decoding method on the receiving device is as follows:

(1) Determine an initial construction sequence (with a length of N) $Q_1^N$ of polar codes, where the construction sequence is a sequence of polar-code polarized channels sorted based on relative reliability under a mother code length. The sequence may be obtained in a manner of table lookup or a manner of online calculation or a manner of half table lookup and half calculation.

(2) Determine an information bit set, a fixed bit set, a punctured/shortened bit set, and an assistant bit set based on a quantity K of information bits, a coding code length M, a rate matching mode, and the initial construction sequence; and determine a scrambled bit set in assistant bits in a same manner as the sending device, in other words, determine, based on a rounding algorithm Integer(X), bits corresponding to several positions in all positions of bits including the information bits and the assistant bits, as the scrambled bit set.

(3) Decode scrambled assistant bits as information bits, in other words, generate a to-be-decoded information bit set (namely, a to-be-decoded sequence).

(4) In a process of decoding the to-be-decoded sequence, based on the determined scrambled bit set, every time a position of a scrambled bit is decoded, the receiving device needs to descramble a decoding result, and then perform checking. The receiving device determines, based on a check result, whether the information comes from the sending device (namely, the UE), and if the check succeeds, continues decoding; otherwise, exits decoding and performs next detection.

In any one of the foregoing implementations, the assistant bits include at least one of the following bits: a CRC bit, a PC bit, and a hash bit.

In the coding method and decoding method provided in any one of the foregoing implementations, in a coding process using polar coding, some bits are selected from the fixed bits and the assistant bits and scrambled, and then polar coding is performed for sending; in a decoding process, when a scrambled bit is decoded, checking may be performed based on a scrambled bit obtained in advance. In this way, a to-be-detected signal that does not come from target UE is eliminated in advance, to shorten a decoding latency, and accelerate channel detection.

In a specific implementation of the foregoing solution, a specific implementation of a scrambling method or determining a position of a scrambled bit further includes the following implementations:

1. Scrambling Method

Usage of Odd-Even Check Scrambling

Even check: Binary SUM of a check equation+Binary value of an RNTI in a check bit position=Binary 0. Operation on an encoder: adding a binary value meeting the check equation in a check bit directly to the binary value of the RNTI in the check bit position to obtain a check bit value for sending.

Odd check: Binary sum of a check equation+Binary value of an RNTI in a check bit position=Binary 1. Operation on an encoder: adding a binary value meeting the check equation in a check bit directly to the binary value of the RNTI in the check bit position and performing negation to obtain a check bit value for sending.

2. Method for Searching for a Scrambled (Check) Bit Position According to a Proportion Objective: Different from the prior art in which scrambled (check) bits are configured in last several unfrozen bit positions, in this application, provided that a false alarm rate meets a requirement, a scrambled (check) bit position is set forward as far as possible to obtain an advantage of early stopping (early stopping means terminating decoding as soon as possible when decoding cannot succeed, to achieve power saving).

Preliminary step: Determine a rate matching scheme, and obtain a reliability sequence.

Step 1: Select an unfrozen bit position set based on reliability.

Unfrozen bits include an information bit, an RNTI scrambled bit, and a check bit (such as a parity check, a CRC check, or a hash check).

Step 2: Segment unfrozen bit positions according to a specific proportion in a sequence of sub-channel indexes (sub-channel index). A specific segmenting manner is shown in the following table:

| Segment 1 (including $J_1$ scrambled/check bits) | Segment 2 (including $J_2$ scrambled/check bits) |
| --- | --- |

The segment 1 includes $J_1$ check bits, and the segment 2 includes $J_2$ check bits (values of $J_1$ and $J_2$ are pending).

Step 3: Calculate a false alarm rate (False Alarm Rate, FAR) segment based on a formula (1).

$$FAR=(BLER_1 \times 2^{-J_1}+(1-BLER_1) \times BLER_2) \times 2^{-J_2} \quad \text{formula (1)};$$

where $BLER_1$ is a block error rate under a given SNR input in the segment 1, that is, a probability of incorrectly decoding at least one bit. $BLER_2$ is a block error rate under a given SNR input in the segment 2. The block error rate may be obtained through Gaussian approximation or density evolution (GA/DE) calculation or by using another method such as Monte Carlo simulation.

Based on simple conversion, a range of the FAR may be obtained:

$$BLER_1 \times 2^{-J_1} \times 2^{-J_2} < FAR < (2^{-J_1}+BLER_2) \times 2^{-J_2}.$$

Step 4: Calculate $J_1$ and $J_2$ allocated when the false alarm rate meets the requirement.

Because the objective is to maximally obtain the advantage of early stopping when the false alarm rate meets the requirement, scrambled (check) bits need to be configured in die segment 1 as many as possible.

Constraints of a system are (1) $FAR < FAR_{requirement}$, and (2) $J_1+J_2=J_{total}$, where $FAR_{requirement}$ is a maximal tolerable false alarm rate, and $J_{total}$ is a total quantity of check (scrambled) bits included in a polar code. Therefore, under the constraints, a maximal $J_1$ value obtained through calculation is a foremost check (scrambled) bit allocation result for early stopping.

Actually, a position of each check (scrambled) bit may be determined by using the following simplified procedure:

Number unfrozen bits from 1 to K'.

For k=1 to K'

Use first to $k^{th}$ unfrozen bits as the segment 1, and use $(k+1)^{th}$ to $K'^{th}$ unfrozen bits as the segment 2.

Under a given SNR, calculate $BLER_2$ (obviously, $BLER_2$ decreases as k increases).

If $BLER_2 < 2^{-1}$, mark current k as a first check (scrambled) bit position.

If $BLER_2 < 2^{-2}$, mark current k as a second check (scrambled) bit position.

If $BLER_2 < 2^{-3}$, mark current k as a third check (scrambled) bit position.

If a quantity of check (scrambled) bits in the segment 1 reaches a preset value, exit the cycle.

Endfor

Output positions of all check (scrambled) bits.

Another manner of determining a scrambled bit: Actually, a position of each check (scrambled) bit may be determined by using the following simplified procedure.

Through calculation of positions of check (scrambled) bits in various code lengths and code rates, it is found that positions of first three check (scrambled) bits are approximately in first 40%, 50%, and 60% unfrozen bit positions. Therefore, this application provides the following simpler method:

Step 1: Obtain percentages ($P_1\%$, $P_2\%$, $P_3\%$, ...) of several first check/scrambled bit positions, and convert them into $K_1^{th}$, $K_2^{th}$, and $K_3^{th}$ positions. For example, $P_1\% \times K' \approx K_1/K'$. $P_1\%$, $P_2\%$, and $P_3\%$ may be preset values such as 40%, 50%, and 60%, or 30%, 40%, and 50%, or ⅜, ⅘, and ⅝.

Figure 8:
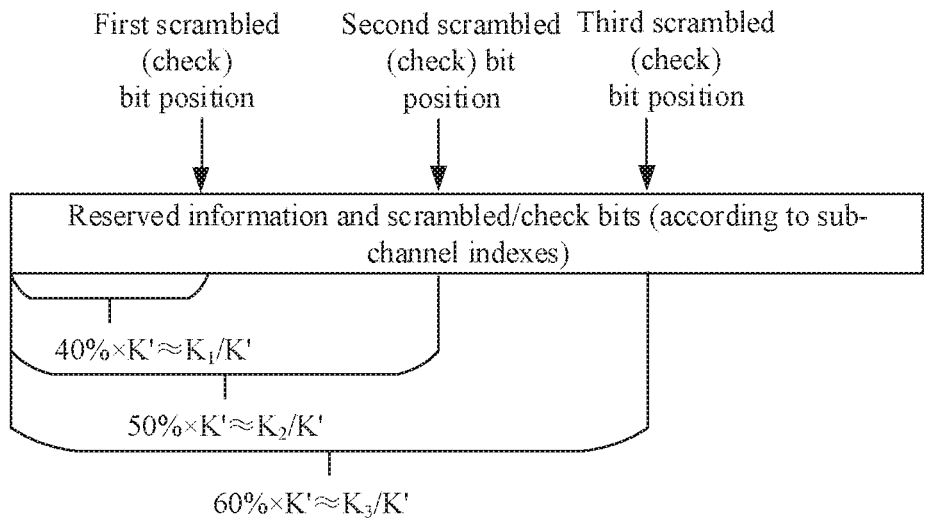
FIG. 8 is a schematic diagram of positions of check/scrambled bits according to this application.

Step 2: As shown in FIG. 8, configure check/scrambled bits in given positions. FIG. 8 is a schematic diagram of positions of checLscrambled bits according to this application.

Another Method for Determining a Scrambled (Check) Bit Position: Searching for a Scrambled (Check) Bit Position According to $w_{min}$ and a Proportion.

Step 1: Select an unfrozen bit position set based on reliability.

Unfrozen bits include an information bit, an RNTI scrambled bit, and a check bit (such as a parity check, a CRC check, or a hash check).

Figure 9:
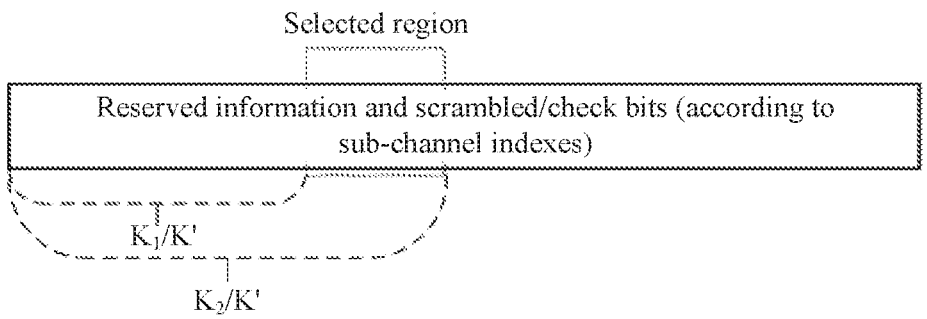
FIG. 9 is another schematic diagram of positions of check/scrambled bits according to this application.

Step 2: As shown in FIG. 9, configure unfrozen bit positions in a sequence of sub-channel indexes (sub-channel index), and select a region of scrambled/check bit positions by using a foregoing method. FIG. 9 is another schematic diagram of positions of check/scrambled bits according to this application.

Step 3: In the selected region, select a position of a specific row weight as a scrambled/check bit position.

Another Method for Determining a Scrambled (Check) Bit Position:

Step 1: Determine a rate matching mode and a reliability sequence.

Step 2: Construct an (M, K') polar code, where a code length is M, and an unfrozen length is K':

$$K'=K+J+J'.$$

Step 3: Determine assistant bit positions:

J CRC bits:

last J positions in K' unfrozen bit positions; and $J'=J_{EC}+J_{ET}$ PC bits (selected according to row weights and regions);

where $J_{EC}$ bits are used for error-correction/screening paths, and $J_{ET}$ bits are used for early stopping.

Step 4: Determine a value of a check bit.

(Option 1) All assistant bits are generated by using a same set of shift registers.

Values of J CRC bits are obtained from final states of the registers.

Values of J' PC bits are obtained from intermediate states of the registers.

(Option 2) Use two sets of shift registers.

J CRC bits are generated by a set of shift registers (values are obtained from final states of the registers).

J' PC bits are generated by another set of shift registers (values are obtained from intermediate states of the registers).

Figure 10:
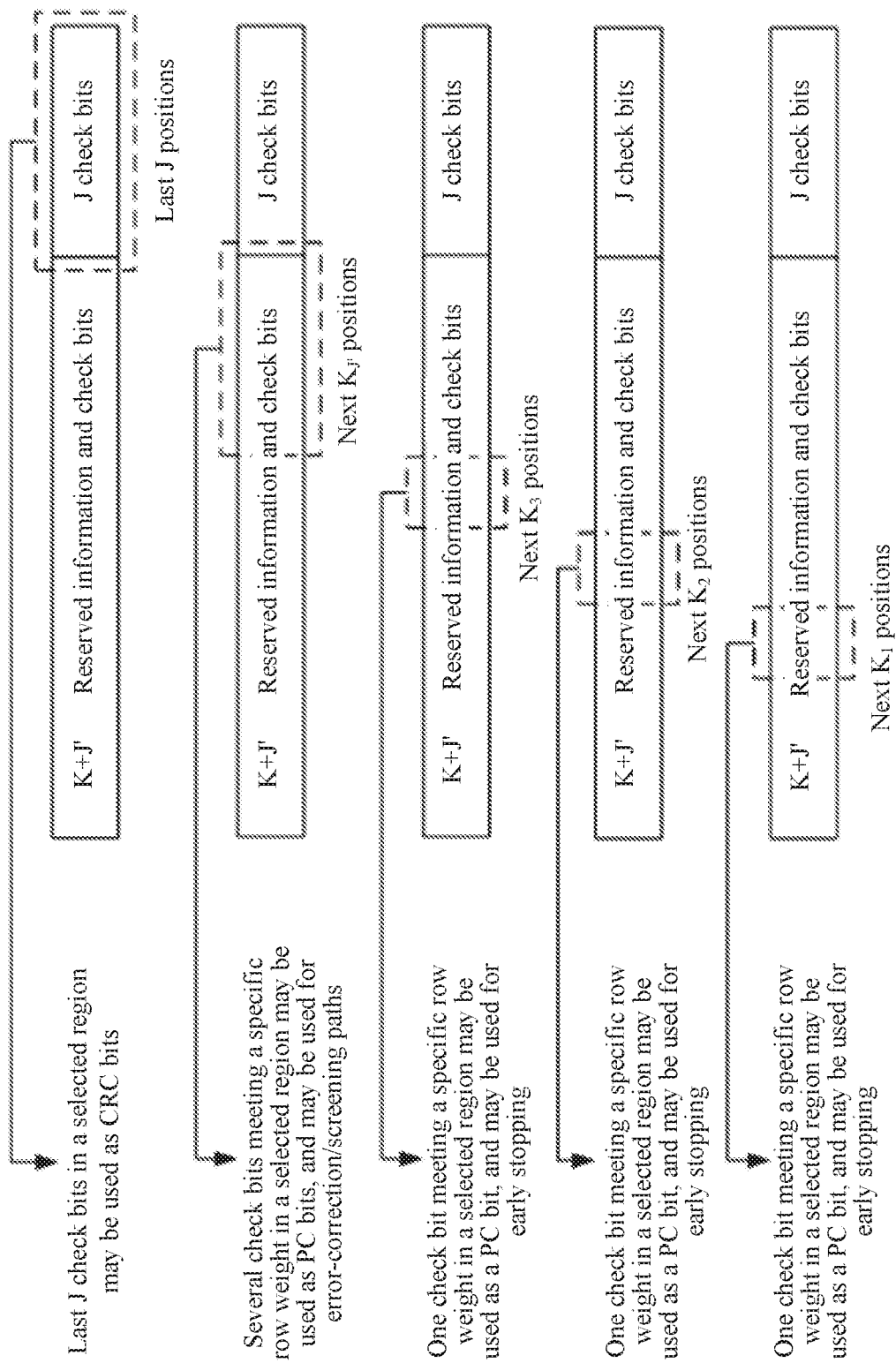
FIG. 10 is another schematic diagram of positions of check/scrambled bits according to this application.
Figure 11:
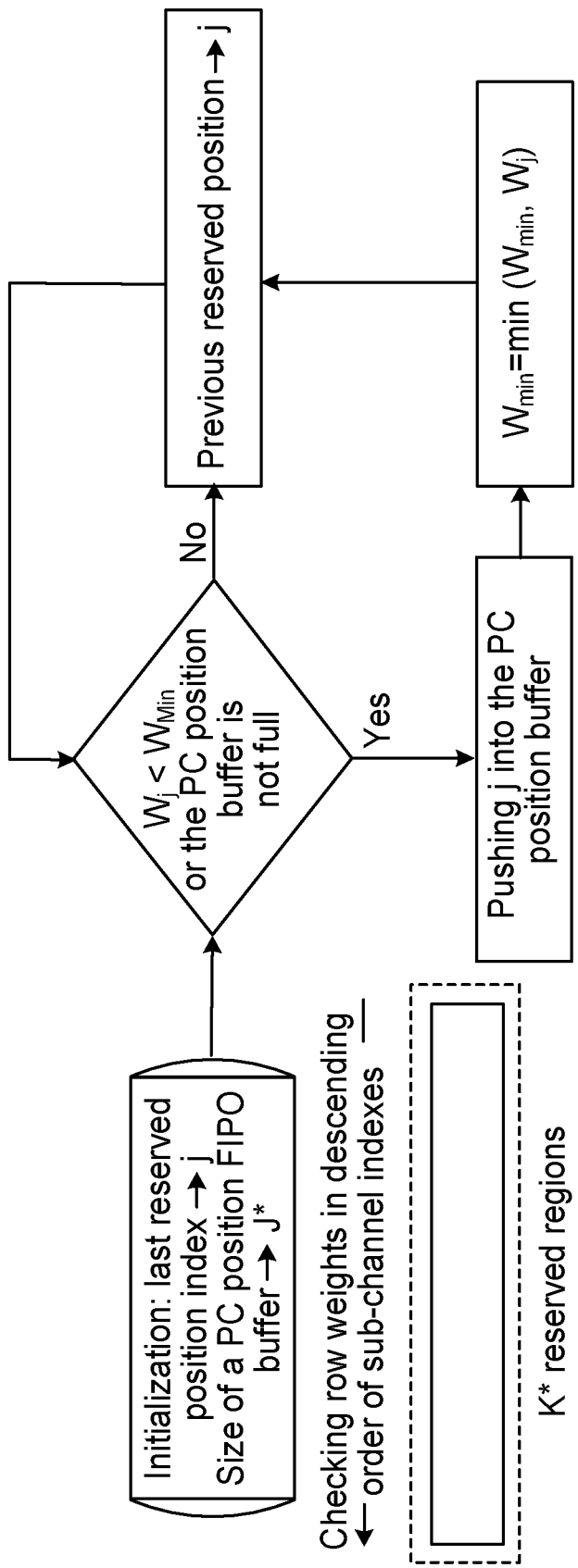
FIG. 11 is another flowchart of determining a position of a check/scrambled bit according to this application.

FIG. 10 is another schematic diagram of positions of check/scrambled bits according to this application. FIG. 11 is another flowchart of determining a position of a check/scrambled bit according to this application. A specific implementation of step 3 of this solution is shown in FIG. 10 and FIG. 11.

Values of $K_{J'}$, $K_3$, $K_2$, and $K_1$ may be obtained by using a simplified method, for example:

$$K_{J'} = 50\% \times K' - J; \text{ and}$$

$$K_3 = K_2 = K_1 = 10\% \times K'.$$

Specific positions of PC bits are positions meeting a specific row weight in a selected region, for example:

Initialization:

Preset a quantity of PC bits in a selected region, and prepare a first in first out buffer (FIFO Buffer) of a corresponding size to store PC bit positions.

Initialize a minimum row weight $w_{min}$ to a maximum value.

Check row weights and determine PC bit positions:

Check a row weight corresponding to each position backward according to a sub-channel index (j).

If (a current row weight $w_j$ is less than $w_{min}$) or (the PC position buffer is not full) or if the PC position exceeds a preset value (that is, the PC position buffer is already full)

pop out a last value of the PC position buffer and delete it.

Endif

Set a current sub-channel index k to a PC position, and push the PC position into the buffer from the beginning.

Update a minimum row weight $w_{min} = \min(w_{min}, \text{current row weight } w_j)$.

Endif

Figure 12:
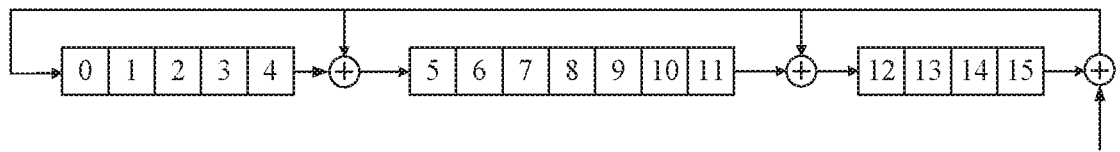
FIG. 12 is a schematic diagram of a register according to this application.

FIG. 12 is a schematic diagram of a register according to this application. A specific method for obtaining a value of the register in step 4 is as follows: A value needs to be obtained from a position in the register when a scrambled/check bit is decoded. A structure of the register is shown in FIG. 12, and information bits are input from a right side.

Two possible methods for operating the register are as follows:

Register mode 1: Shift only for pure information bits (not including frozen bits and various assistant bits), and when a scrambled/check bit position is encountered, obtain a value from an $i^{th}$ position in the register, where i=mod((1=k+C), length of the register).

The length of the register may be J+J', in other words, a total quantity of scrambled/check bits, where l means that a first scrambled/check bit is encountered currently, and k means that k pure information bits are already decoded currently. Mod is a modulo operation, and a result thereof is a non-negative integer from 0 to (the length of the register minus 1). C is an offset and may be any constant.

Register mode 2: Shift for all bits (including pure information bits, frozen bits, and various assistant bits), and when a scrambled/check bit position is encountered, obtain a value from an $i^{th}$ position in the register, where i=mod((1−n+C), length of the register).

The length of the register may be J+J', in other words, a total quantity of scrambled/check bits, where l means that a first scrambled/check bit is encountered currently, and n means a position of a current bit in a mother code (including pure information bits, frozen bits, and various assistant bits). Mod is a modulo operation, and a result thereof is a non-negative integer from 0 to (the length of the register minus 1). C is an offset and may be any constant.

Figure 13:
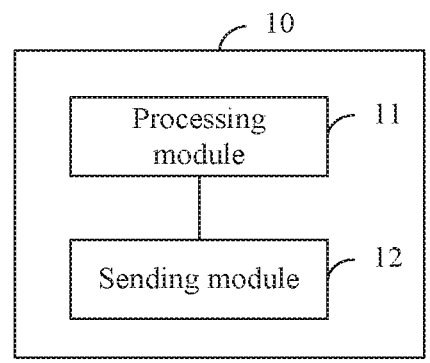
FIG. 13 is a schematic structural diagram of a coding apparatus according to this application.

FIG. 13 is a schematic structural diagram of a coding apparatus according to this application. As shown in FIG. 13, the coding apparatus 10 includes:

a processing module 11, configured to obtain positions of information bits, positions of fixed bits, and positions of assistant bits, where the processing module 11 is further configured to allocate the information bits, the fixed bits, and the assistant bits in a to-be-coded sequence based on the positions of the information bits, the positions of the fixed bits, and the positions of the assistant bits;

the processing module 11 is further configured to: obtain a scrambling sequence, and scramble a bit in a to-be-scrambled bit set based on the scrambling sequence to obtain a scrambled sequence, where the to-be-scrambled bit set is determined based on the fixed bits and/or the assistant bits; and the processing module 11 is further configured to perform polar coding on the scrambled sequence to obtain a coded sequence; and a sending module 12, configured to send the coded sequence.

The coding apparatus provided in this embodiment is configured to implement the technical solution on the sending device side according to any one of the foregoing method embodiments. Implementation principles and technical effects thereof are similar, and are not described herein again.

The scrambling sequence obtained by the processing module is a radio network temporary identifier RNTI of the coding apparatus.

Optionally, the to-be-scrambled bit set determined by the processing module 11 includes any one of the following sets:

a set including at least one of the fixed bits in descending order of reliability, starting from the highest;

a set including at least one of the fixed bits in ascending order of reliability, starting from the lowest;

a set including at least one of the fixed bits before an information bit;

a set including at least one of the fixed bits in descending order of row weights of a corresponding polar coding matrix, starting from the highest;

a set including at least one of the assistant bits in ascending order of positions, starting from the foremost;

a set including at least one of the assistant bits in descending order of reliability, starting from the highest;

a set including at least one of the assistant bits in ascending order of reliability, starting from the lowest;

a set including at least one of the assistant bits in descending order of row weights of a corresponding polar coding matrix, starting from the highest;

a set including at least one of the fixed bits and the assistant bits in ascending order of positions, starting from the foremost;

a set including at least one of the fixed bits and the assistant bits in ascending order of reliability, starting from the lowest;

a set including at least one of the fixed bits and the assistant bits in descending order of reliability, starting from the highest; and a set including at least one of the fixed bits and the assistant bits in descending order of row weights of a corresponding polar coding matrix, starting from the highest;

Optionally, the processing module 11 is configured to:

perform an exclusive-OR operation on the scrambling sequence and a corresponding bit in the to-be-scrambled bit set, and allocate an obtained bit in a corresponding position to obtain the scrambled sequence.

Optionally, the assistant bits include at least one of the following bits:

a CRC bit, a PC bit, and a hash bit.

Optionally, when a length of the scrambling sequence is greater than a quantity of bits in the to-be-scrambled bit set, the processing module 11 is further configured to:

obtain, from the scrambling sequence, a quantity of bits the same as that of bits in the to-be-scrambled bit set to serve as a new scrambling sequence.

The coding apparatus provided in any one of the foregoing solutions is configured to implement the technical solution on the sending device side according to any one of the foregoing method embodiments. Implementation principles and technical effects thereof are similar, and are not described herein again.

In another embodiment of the coding apparatus provided in this application, the processing module 11 is configured to determine positions of information bits and assistant bits and positions of fixed bits;

the processing module 11 is further configured to determine a position of a to-be-scrambled bit based on the positions of the information bits and the assistant bits;

the processing module 11 is further configured to allocate the information bits, the fixed bits, and the assistant bits in a to-be-coded sequence based on the position of the to-be-scrambled bit, the positions of the information bits and the assistant bits, and the positions of the fixed bits;

the processing module 11 is further configured to: obtain a scrambling sequence, and perform, based on the scrambling sequence, scrambling the to-be-scrambled bit to obtain a scrambled sequence;

the processing module 11 is further configured to perform polar coding on the scrambled sequence to obtain a coded sequence; and the sending module 12 is configured to send the coded sequence to a receiving device.

Optionally, the position of the to-be-scrambled bit that is determined by the processing module 11 includes any one of the following positions:

at least one of the positions of the information bits and the assistant bits in ascending order of positions, starting from the foremost;

at least one of the positions of the information bits and the assistant bits in descending order of reliability, starting from the highest;

at least one of the positions of the information bits and the assistant bits in ascending order of reliability, starting from the lowest; and at least one of the positions of the information bits and the assistant bits in descending order of row weights of a corresponding polar coding matrix, starting from the highest.

The coding apparatus provided in this embodiment is configured to implement the technical solution on the sending device side according to any one of the foregoing method embodiments. Implementation principles and technical effects thereof are similar, and are not described herein again.

Figure 14:
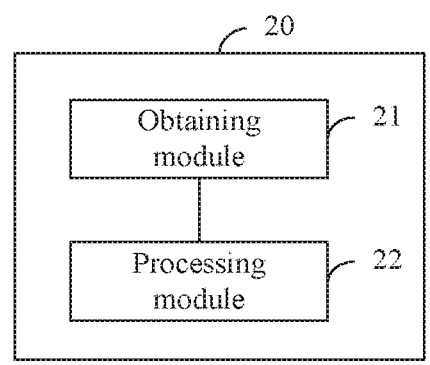
FIG. 14 is a schematic structural diagram of a decoding apparatus according to this application.

FIG. 14 is a schematic structural diagram of a decoding apparatus according to this application. As shown in FIG. 14, the decoding apparatus 20 includes:

an obtaining module 21, configured to obtain a to-be-decoded sequence; and a processing module 22, configured to: decode and check the to-be-decoded sequence in sequence; and when decoding a scrambled bit, check the scrambled bit, and if the check fails, terminate the decoding, where the scrambled bit is obtained after a bit in a scrambled bit set is scrambled by using a scrambling sequence, and the scrambled bit set is determined based on fixed bits and/or assistant bits.

Optionally, the scrambled bit is a fixed bit, and the processing module is configured to:

perform checking based on a scrambled bit value obtained through decoding and a scrambled bit value obtained in advance, where if the scrambled bit value obtained through decoding is different from the scrambled bit value obtained in advance, the check fails.

The decoding apparatus provided in this embodiment is configured to implement the technical solution on the receiving device side according to any one of the foregoing method embodiments implementation principles and technical effects thereof are similar, and are not described herein again.

Optionally, the scrambling sequence is an RNTI of a sending device.

Optionally, the scrambled bit set determined by the obtaining module 21 includes any one of the following sets:

a set including at least one of the fixed bits in descending order of reliability, starting from the highest;

a set including at least one of the fixed bits in ascending order of reliability, starting from the lowest;

a set including at least one of the fixed bits before an information bit;

a set including at least one of the fixed bits in descending order of row weights of a corresponding polar coding matrix, starting from the highest;

a set including at least one of the assistant bits in ascending order of positions, starting from the foremost;

a set including at least one of the assistant bits in descending order of reliability, starting from the highest;

a set including at least one of the assistant bits in ascending order of reliability, starting from the lowest;

a set including at least one of the assistant bits in descending order of row weights of a corresponding polar coding matrix, starting from the highest;

a set including at least one of the fixed bits and the assistant bits in ascending order of positions, starting from the foremost;

a set including at least one of the fixed bits and the assistant bits in ascending order of reliability, starting from the lowest;

a set including at least one of the fixed bits and the assistant bits in descending order of reliability, starting from the highest; and a set including at least one of the fixed bits and the assistant bits in descending order of row weights of a corresponding polar coding matrix, starting from the highest;

Optionally, the processing module 22 is configured to:

determine positions of information bits, positions of the fixed bits, and positions of the assistant bits;

determine the scrambled bit set based on the positions of the fixed bits and/or the positions of the assistant bits; and perform polar decoding on the to-be-decoded sequence in sequence, check the scrambled bit when decoding the scrambled bit, and terminate the decoding if the check fails.

Optionally, the assistant bits include at least one of the following bits:

a CRC bit, a PC bit, and a hash bit.

The decoding apparatus provided in any one of the foregoing implementations is configured to implement the technical solution on the receiving device side according to any one of the foregoing method embodiments. Implementation principles and technical effects thereof are similar, and are not described herein again.

It should be understood that in an implementation of the coding apparatus or the decoding apparatus, the processing module may be implemented as a processor, and the sending module may be implemented as a transmitter.

This application further provides a sending device, including a memory, a processor, a transmitter, and a computer program. The computer program is stored in the memory, and the processor runs the computer program to perform the coding method provided in any one of the foregoing embodiments.

In a specific implementation of the sending device, there is at least one processor that is configured to execute an executable instruction stored in the memory, namely, the computer program. Therefore, by exchanging data with a receiving device by using a communications interface, the sending device performs the coding method provided in any one of the foregoing implementations. Optionally, the memory may be further integrated in the processor.

This application further provides a receiving device, including a memory, a processor, and a computer program. The computer program is stored in the memory, and the processor runs the computer program to perform the decoding method provided in any one of the foregoing embodiments.

In a specific implementation of the receiving device, there is at least one processor that is configured to execute an executable instruction stored in the memory, namely, the computer program. Therefore, by exchanging data with a sending device by using a communications interface, the receiving device performs the decoding method provided in any one of the foregoing implementations. Optionally, the memory may be further integrated in the processor.

This application further provides a storage medium, including a readable storage medium and a computer program. The computer program is used to implement the coding method provided in any one of the foregoing embodiments.

This application further provides a storage medium, including a readable storage medium and a computer program. The computer program is used to implement the decoding method provided in any one of the foregoing embodiments.

This application further provides a program product. The program product includes a computer program (in other words, an executable instruction), and the computer program is stored in a readable storage medium. At least one processor of a sending device may read the computer program from the readable storage medium, and the at least one processor executes the computer program, so that the sending device implements the coding method provided in the foregoing implementations.

This application further provides a program product. The program product includes a computer program (in other words, an executable instruction), and the computer program is stored in a readable storage medium. At least one processor of a receiving device may read the computer program from the readable storage medium, and the at least one processor executes the computer program, so that the receiving device implements the decoding method provided in the foregoing implementations.

In the foregoing implementation of the sending device or the receiving device, it should be understood that the processor may be a central processing unit (CPU), or may be another general-purpose processor, a digital signal processor (DSP), an application-specific integrated circuit (ASIC), or the like. The general purpose processor may be a microprocessor, or the processor may be any conventional processor or the like. The steps of the methods disclosed with reference to this application may be directly implemented by a hardware processor, or may be implemented by a combination of hardware and a software module in a processor.

All or some of the steps for implementing the foregoing method embodiments may be implemented by hardware instructed by a program. The program may be stored in a computer-readable memory. When the program is executed, the steps of the methods in the embodiments are performed. The memory (storage medium) includes: a read-only memory (ROM), a RAM, a flash memory, a hard disk, a solid state disk, a magnetic tape, a floppy disk, an optical disc, and any combination thereof.

What is claimed is:

1. A coding method, wherein the method comprises:
   obtaining, by a sending device, positions of information bits, positions of fixed bits, and positions of assistant bits;
   allocating, by the sending device, the information bits, the fixed bits, and the assistant bits in a to-be-coded sequence based on the positions of the information bits, the positions of the fixed bits, and the positions of the assistant bits;
   obtaining, by the sending device, a scrambling sequence;
   scrambling, by the sending device, a bit in a to-be-scrambled bit set based on the scrambling sequence to obtain a scrambled sequence, wherein the to-be-scrambled bit set is determined based on at least one of the fixed bits or the assistant bits;
   performing, by the sending device, polar coding on the scrambled sequence to obtain a coded sequence; and
   sending, by the sending device, the coded sequence.

2. The method according to claim 1, wherein the scrambling sequence is a radio network temporary identifier (RNTI) sequence of the sending device.

3. The method according to claim 1, wherein the to-be-scrambled bit set comprises one or more assistant bits.

4. The method according to claim 1, wherein the to-be-scrambled bit set comprises any one of the following sets:
   a set comprising at least one of the fixed bits in descending order of reliability, starting from the highest;
   a set comprising at least one of the fixed bits in ascending order of reliability, starting from the lowest;
   a set comprising at least one of the fixed bits before an information bit;
   a set comprising at least one of the fixed bits in descending order of row weights of a corresponding polar coding matrix, starting from the highest;
   a set comprising at least one of the assistant bits in ascending order of positions, starting from the foremost;

a set comprising at least one of the assistant bits in descending order of reliability, starting from the highest;

a set comprising at least one of the assistant bits in ascending order of reliability, starting from the lowest;

a set comprising at least one of the assistant bits in descending order of row weights of a corresponding polar coding matrix, starting from the highest;

a set comprising at least one of the fixed bits and the assistant bits in ascending order of positions, starting from the foremost;

a set comprising at least one of the fixed bits and the assistant bits in ascending order of reliability, starting from the lowest;

a set comprising at least one of the fixed bits and the assistant bits in descending order of reliability, starting from the highest; and a set comprising at least one of the fixed bits and the assistant bits in descending order of row weights of a corresponding polar coding matrix, starting from the highest.

5. The method according to claim 1, wherein the scrambling, by the sending device, a bit in a to-be-scrambled bit set based on the scrambling sequence to obtain a scrambled sequence comprises:

performing, by the sending device, an exclusive-OR operation on the scrambling sequence and a corresponding bit in the to-be-scrambled bit set; and allocating, by the sending device, an obtained bit in a corresponding position to obtain the scrambled sequence.

6. The method according to claim 1, wherein the assistant bits comprise at least one of the following bits:

a cyclic redundancy check (CRC) bit, a parity check (PC) bit, and a hash bit.

7. The method according to claim 1, wherein when a length of the scrambling sequence is greater than a quantity of bits in the to-be-scrambled bit set, before the scrambling a bit in the to-be-scrambled bit set based on the scrambling sequence to obtain a scrambled sequence, the method further comprises:

obtaining, by the sending device, from the scrambling sequence, a quantity of bits the same as that of bits in the to-be-scrambled bit set to serve as a new scrambling sequence.

8. A coding device, wherein the device comprises:

at least one processor; and a non-transitory computer-readable storage medium coupled to the at least one processor and storing programming instructions for execution by the at least one processor, wherein the programming instructions instruct the at least one processor to:

obtain positions of information bits, positions of fixed bits, and positions of assistant bits;

allocate the information bits, the fixed bits, and the assistant bits in a to-be-coded sequence based on the positions of the information bits, the positions of the fixed bits, and the positions of the assistant bits;

obtain a scrambling sequence;

scramble a bit in a to-be-scrambled bit set based on the scrambling sequence to obtain a scrambled sequence, wherein the to-be-scrambled bit set is determined based on at least one of the fixed bits or the assistant bits;

perform polar coding on the scrambled sequence to obtain a coded sequence; and output the coded sequence.

9. The device according to claim 8, wherein the scrambling sequence obtained by the processor is a radio network temporary identifier (RNTI) of the coding device.

10. The device according to claim 8, wherein the to-be-scrambled bit set comprises one or more assistant bits.

11. The device according to claim 8, wherein the to-be-scrambled bit set comprises any one of the following sets:

a set comprising at least one of the fixed bits in descending order of reliability, starting from the highest;

a set comprising at least one of the fixed bits in ascending order of reliability, starting from the lowest;

a set comprising at least one of the fixed bits before an information bit;

a set comprising at least one of the fixed bits in descending order of row weights of a corresponding polar coding matrix, starting from the highest;

a set comprising at least one of the assistant bits in ascending order of positions, starting from the foremost;

a set comprising at least one of the assistant bits in descending order of reliability, starting from the highest;

a set comprising at least one of the assistant bits in ascending order of reliability, starting from the lowest;

a set comprising at least one of the assistant bits in descending order of row weights of a corresponding polar coding matrix, starting from the highest;

a set comprising at least one of the fixed bits and the assistant bits in ascending order of positions, starting from the foremost;

a set comprising at least one of the fixed bits and the assistant bits in ascending order of reliability, starting from the lowest;

a set comprising at least one of the fixed bits and the assistant bits in descending order of reliability, starting from the highest; and a set comprising at least one of the fixed bits and the assistant bits in descending order of row weights of a corresponding polar coding matrix, starting from the highest.

12. The device according to claim 8, wherein the programming instructions further instruct the at least one processor to:

perform an exclusive-OR operation on the scrambling sequence and a corresponding bit in the to-be-scrambled bit set; and allocate an obtained bit in a corresponding position to obtain the scrambled sequence.

13. The device according to claim 8, wherein the assistant bits comprise at least one of the following bits:

a cyclic redundancy check (CRC) bit, a parity check (PC) bit, and a hash bit.

14. The device according to claim 8, wherein when a length of the scrambling sequence is greater than a quantity of bits in the to-be-scrambled bit set, the processor is further configured to:

obtain, from the scrambling sequence, a quantity of bits the same as that of bits in the to-be-scrambled bit set to serve as a new scrambling sequence.

15. A non-transitory computer-readable storage medium comprising instructions which, when executed by one or more processors in a coding device, cause the coding device to:

obtain positions of information bits, positions of fixed bits, and positions of assistant bits;

allocate the information bits, the fixed bits, and the assistant bits in a to-be-coded sequence based on the positions of the information bits, the positions of the fixed bits, and the positions of the assistant bits;

obtain a scrambling sequence;

scramble a bit in a to-be-scrambled bit set based on the scrambling sequence to obtain a scrambled sequence, wherein the to-be-scrambled bit set is determined based on at least one of the fixed bits or the assistant bits;

perform polar coding on the scrambled sequence to obtain a coded sequence; and output the coded sequence.

16. The computer-readable storage medium according to claim 15, wherein the scrambling sequence is a radio network temporary identifier (RNTI) sequence of the coding device.

17. The computer-readable storage medium according to claim 15, wherein the to-be-scrambled bit set comprises one or more assistant bits.

18. The computer-readable storage medium according to claim 15, wherein the to-be-scrambled bit set comprises any one of the following sets:

a set comprising at least one of the fixed bits in descending order of reliability, starting from the highest;

a set comprising at least one of the fixed bits in ascending order of reliability, starting from the lowest;

a set comprising at least one of the fixed bits before an information bit;

a set comprising at least one of the fixed bits in descending order of row weights of a corresponding polar coding matrix, starting from the highest;

a set comprising at least one of the assistant bits in ascending order of positions, starting from the foremost;

a set comprising at least one of the assistant bits in descending order of reliability, starting from the highest;

a set comprising at least one of the assistant bits in ascending order of reliability, starting from the lowest;

a set comprising at least one of the assistant bits in descending order of row weights of a corresponding polar coding matrix, starting from the highest;

a set comprising at least one of the fixed bits and the assistant bits in ascending order of positions, starting from the foremost;

a set comprising at least one of the fixed bits and the assistant bits in ascending order of reliability, starting from the lowest;

a set comprising at least one of the fixed bits and the assistant bits in descending order of reliability, starting from the highest; and a set comprising at least one of the fixed bits and the assistant bits in descending order of row weights of a corresponding polar coding matrix, starting from the highest.

19. The computer-readable storage medium according to claim 15, wherein the assistant bits comprise at least one of the following bits:

a cyclic redundancy check (CRC) bit, a parity check (PC) bit, and a hash bit.

20. The computer-readable storage medium according to claim 15, wherein when a length of the scrambling sequence is greater than a quantity of bits in the to-be-scrambled bit set, before the scrambling a bit in the to-be-scrambled bit set based on the scrambling sequence to obtain a scrambled sequence, the instructions cause the coding device to:

obtain, from the scrambling sequence, a quantity of bits the same as that of bits in the to-be-scrambled bit set to serve as a new scrambling sequence.

* * * * *